(12) United States Patent
Terashima et al.

(10) Patent No.: US 8,742,258 B2
(45) Date of Patent: Jun. 3, 2014

(54) BONDING WIRE FOR SEMICONDUCTOR

(75) Inventors: Shinichi Terashima, Tokyo (JP); Tomohiro Uno, Tokyo (JP); Takashi Yamada, Saitama (JP); Daizo Oda, Saitama (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 104 days.

(21) Appl. No.: 13/384,819

(22) PCT Filed: Jul. 16, 2010

(86) PCT No.: PCT/JP2010/062082
§ 371 (c)(1),
(2), (4) Date: Jan. 19, 2012

(87) PCT Pub. No.: WO2011/013527
PCT Pub. Date: Feb. 3, 2011

(65) Prior Publication Data
US 2012/0118610 A1    May 17, 2012
US 2013/0306352 A2    Nov. 21, 2013

(30) Foreign Application Priority Data
Jul. 30, 2009  (JP) ................. 2009-177315
Sep. 30, 2009  (JP) ................. 2009-226464

(51) Int. Cl.
*H01B 5/00* (2006.01)
(52) U.S. Cl.
USPC ........................................ 174/126.2
(58) Field of Classification Search
USPC ........................................ 174/126.2
See application file for complete search history.

(56) References Cited

U.S. PATENT DOCUMENTS

| | | | |
|---|---|---|---|
| 2004/0014266 A1* | 1/2004 | Uno et al. | 438/200 |
| 2005/0079347 A1* | 4/2005 | Uno et al. | 428/364 |
| 2005/0151253 A1* | 7/2005 | Nonaka et al. | 257/741 |
| 2007/0235887 A1* | 10/2007 | Kaimori et al. | 257/784 |
| 2009/0188696 A1* | 7/2009 | Uno et al. | 174/126.2 |
| 2010/0171222 A1* | 7/2010 | Murai et al. | 257/771 |
| 2010/0282495 A1* | 11/2010 | Uno et al. | 174/126.2 |
| 2010/0294532 A1* | 11/2010 | Uno et al. | 174/102 R |
| 2011/0011619 A1* | 1/2011 | Uno et al. | 174/126.2 |

FOREIGN PATENT DOCUMENTS

| | | | |
|---|---|---|---|
| EP | 1447842 A1 * | 8/2004 | |
| GB | 2220956 A * | 1/1990 | |
| JP | 57-12543 A | 1/1982 | |
| JP | 59-155161 A | 9/1984 | |
| JP | 59-181040 A | 10/1984 | |
| JP | 61-285743 A | 12/1986 | |
| JP | 62-97360 A | 5/1987 | |
| JP | 62-120057 A | 6/1987 | |
| JP | 63-46738 A | 2/1988 | |
| JP | 1-291435 A | 11/1989 | |
| JP | 3-32033 A | 2/1991 | |
| JP | 4-206646 A | 7/1992 | |
| JP | 2003-59963 A | 2/2003 | |
| JP | 2004-6740 A | 1/2004 | |
| JP | 2005-268771 A | 9/2005 | |
| JP | 2006-190763 A | 7/2006 | |
| WO | 02/23618 A1 | 3/2002 | |

* cited by examiner

*Primary Examiner* — William H Mayo, III
*Assistant Examiner* — Rhadames J Alonzo Miller
(74) *Attorney, Agent, or Firm* — McDermott Will & Emery LLP

(57) ABSTRACT

A bonding wire for semiconductor includes: a core wire of copper or a copper alloy; a coating layer containing palladium and having a thickness of 10 to 200 nm; and an alloy layer formed on a surface of the coating layer. The alloy layer contains a noble metal and palladium and having a thickness of 1 to 80 nm. The noble metal is either gold or silver, and a concentration of the noble metal in the alloy layer is not less than 10% and not more than 75% by volume.

15 Claims, No Drawings

BONDING WIRE FOR SEMICONDUCTOR

CROSS REFERENCE TO PRIOR APPLICATIONS

This application is a U.S. National Phase application under 35 U.S.C. §371 of International Application No. PCT/JP2010/062082, filed on Jul. 16, 2010 and claims benefit of priority to Japanese Patent Application No. 2009-177315, filed on Jul. 30, 2009 and Japanese Patent Application No, 2009-226464, filed on Sep. 30, 2009. The International Application was published in Japanese on Feb. 3, 2011 as WO 2011/013527 A1 under PCI Article 21(2). All these applications are herein incorporated by reference.

TECHNICAL FIELD

The present invention relates to a bonding wire for semiconductor used to connect an electrode on a semiconductor device to an external connection terminal.

BACKGROUND ART

As a bonding wire for semiconductor used to connect an electrode on a semiconductor device to an external connection terminal (referred to as "bonding wire" hereunder), there has been mainly used, nowadays, a bonding wire (gold bonding wire) having a wire diameter of about 20 to 50 μm and being made of 4N gold (Au) with a high purity (4-Nine, a purity of 99.99% by mass or higher). In general, there has conventionally been performed ball bonding featuring a thermal compressive bonding technique with the aid of ultrasound, in order to bond the gold bonding wire to an electrode on a silicon chip serving as a semiconductor device, i.e., a method in which a general bonding device is used so as to pass the gold bonding wire through a jig called capillary, followed by heating and melting a front end of this bonding wire through an arc heat input, thus forming a ball thereon due to a surface tension, such ball being further pressed and bonded to the aforementioned electrode heated up to a temperature in a range of 150 to 300° C.

In contrast, there has conventionally been performed so-called wedge bonding to bond the gold bonding wire directly to an electrode without forming the aforementioned ball, when connecting the corresponding bonding wire to an external connection terminal such as a lead, a land or the like. In recent years, there have been observed rapid diversifications in a semiconductor mounting structure, material and connection technology. For example, in addition to the existing QFP (Quad Flat Packaging) using a lead frame, there have been put to practical use new mounting methods including: BGA (Ball Grid Array) using a substrate, a polyimide tape and the like; CSP (Chip Scale Packaging) and the like, with the external connection terminal being diversified. For this reason, a wedge bonding property has become more crucial than ever.

Further, since there is a growing need for miniaturization of semiconductor devices and performing thin-mounting accordingly, there have been increasingly employed: a low loop bonding technique featuring a low loop height of a bonding wire; a reverse bonding technique for releasing loops upward toward multilayered chips from a substrate side, and the like.

With resource prices escalating in recent days, there has also been a steep rise in the price of gold employed as a raw material of the gold bonding. Here, copper (Cu) has been considered a substitute for gold as a low-cost material for a bonding wire. However, since copper is more susceptible to oxidation than gold, it is difficult to store a simple copper bonding wire for a long period of time, and there cannot be achieved a favorable wedge bonding property with such bonding wire. Further, a ball formed on a front end of such simple copper bonding wire actually has to be formed under a reductive atmosphere so that the ball thus formed is not oxidized. Specifically, the reductive atmosphere around the ball is generally given using a gas prepared by mixing hydrogen ($H_2$) of about 4% by volume into nitrogen ($N_2$). However, it is still difficult to achieve such a favorable ball bonding property as is the case in the gold bonding wire. For those reasons, the copper bonding wire has not yet been widely employed in the LSI industry overall.

Here, in order to provide a solution to the oxidation of the copper bonding wire, there has been proposed a type of copper bonding wire with silver (Ag) coated on a surface of a copper wire. For example, in a patent document 1, although there is not disclosed a specific example of how a copper wire is coated with silver, there are disclosed kinds of both inner metals and surface coating metals for the bonding wire. Specifically, the inner metals are non-pure noble metals including aluminum (Al), copper, iron (Fe), an alloy of iron and nickel (FeNi) and the like. And, the surface coating metals are metals having corrosion resistance to moisture, salt content, alkalis or the like, such metals including gold and silver. Further, in a patent document 2, although there is not disclosed a specific example of how a copper wire is coated with silver, there is disclosed a copper bonding wire with a noble metal such as gold, silver or the like coated on a copper wire. According to the patent document 2, there can be achieved a further improved corrosion resistance property with the copper wire thus coated. A patent document 3 discloses a bonding wire composed of an aluminum (Al) wire or a copper wire, such aluminum wire or copper wire being further plated with a noble metal such as gold, silver or the like. The copper bonding wire according to the patent document 3 can provide a solution to corrosion and to thermal oxidation due to the plating, and allows a reliable bondability to be achieved with respect to a lead frame as is the case in the gold bonding wire. A patent document 4 discloses a copper bonding wire with a noble metal or anticorrosion metal coated on a surface of a high-purity copper extra fine wire, such noble metal, however, being not limited to silver. This composition allows surface oxidation of the corresponding copper bonding wire to be controlled (particularly, the presence of surface oxidation after being left for 10 days in the atmosphere). Further, a diameter of the aforementioned copper extra fine wire is 15 to 80 μm, and a coating layer formed in this case has an average layer thickness of 10 nm to 1 μm (the diameter of the wire is 25 μm, and the average layer thickness of the coating layer is actually 0.1 μm in an example). A patent document 5 discloses a copper bonding wire with silver coated on a surface of a copper fine wire, such silver coating being 0.001 to 0.01 times thicker than a diameter of the copper fine wire. Namely, when the diameter of the copper fine wire is 25 μm, the thickness of silver coated thereon is 0.02 to 0.3 μm. Such a kind of silver coating not only controls oxidation of copper, but also improves a ball formability.

Further, in order to provide a solution to oxidation of the copper bonding wire, there has been proposed a copper bonding wire with a noble metal, particularly, gold (Au) coated on a surface of a copper wire. For example, in the patent document 1, although there is not disclosed a specific example of how a copper wire is coated with gold, there are disclosed the kinds of both the inner metals and the surface coating metals for the bonding wire. Specifically, the inner metals are non-pure noble metals including aluminum (Al), copper, iron (Fe), an alloy of iron and nickel (FeNi) and the like. And, the surface coating metals are metals having corrosion resistance to moisture, salt content, alkalis or the like, such metals including gold and silver. A patent document 7 discloses a bonding wire composed of a core wire made of copper or a copper alloy containing tin, such core wire being further plated with gold so as to improve a breaking strength of the bonding wire. Further, in the patent document 2, although there is not disclosed a specific example of how a copper wire is coated with gold, there is disclosed the copper bonding wire with a noble metal such as gold, silver or the like coated on the copper wire. According to the patent document 2, there can be achieved a further improved corrosion resistance property with the copper wire thus coated. The patent document 3 discloses the bonding wire composed of the aluminum (Al) wire or the copper wire, such aluminum wire or copper wire being further plated with a noble metal such as gold, silver or the like. The copper bonding wire according to the patent document 3 can provide a solution to corrosion and to thermal oxidation due to the plating, and allows a reliable bondability to be achieved with respect to a lead frame as is the case in the gold bonding wire. The patent document 4 discloses the copper bonding wire with a noble metal or anticorrosion metal coated on the surface of the high-purity copper extra fine wire, such noble metal, however, being not limited to gold. This composition allows surface oxidation of the corresponding copper bonding wire to be controlled (particularly, the presence of surface oxidation after being left for 10 days in the atmosphere). Further, the diameter of the aforementioned copper extra fine wire is 15 to 80 μm, and the coating layer formed in this case has the average layer thickness of 10 nm to 1 μm (the diameter of the wire is 25 μm, and the average layer thickness of the coating layer is actually 0.1 μm in an example). A patent document 8 discloses coating of an outer periphery of a copper core wire with gold, such coating improving a bondability with respect to an electrode made of aluminum. A patent document 9 discloses a compound conductor composed of a core material that does not plastically deform, and an outer peripheral material softer than the core material and capable of undergoing plastic deformation. As an example, gold and a copper alloy are employed as the core material and the outer peripheral material, respectively, thus improving a connection strength between the conductive wire and a circuit. A patent document 10 discloses coating of an outside of a copper alloy with gold or a gold alloy, such coating preventing bonding wires from coming in contact with one another at the time of resin-sealing a semiconductor device. A patent document 11 discloses how pure gold is used to plate a surface of a wire rod made of an oxygen-free copper wire, and a bonding wire with a high signal conductivity and superior in high-frequency transmission accordingly. A patent document 12 discloses a bonding wire comprising: a core material mainly composed of copper; a dissimilar metal layer formed on the core material and made of a metal other than copper; and a coating layer formed on the dissimilar metal layer and made of an oxidation-resistant metal having a melting point higher than that of copper. The bonding wire according to the patent document 12 allows a spherical ball to be formed stably, and exhibits a superior adhesion between the coating layer and the core material.

However, with regard to the aforementioned copper bonding wires with silver or gold coated on the surfaces thereof, although there can be controlled surface oxidation of copper (particularly, progress of oxidation during storage), it is highly likely that the balls formed on the front ends of the bonding wires are deformed and fail to become spheres when performing bonding, thus preventing the corresponding copper bonding wires from being put to practical use. This is because, when coated with silver, such silver with a low melting point (melting point 961° C.) is preferentially melted as the front end of the bonding wire is being heated and melted through the arc heat input, whereas copper with a high melting point (melting point 1083° C.) is only partially melted at that time. Further, when coated with gold, copper with a large specific heat (380 J/kg·K) is not easily melted as the front end of the bonding wire is being heated and melted through the arc heat input, whereas gold with a small specific heat (128 J/kg·K) can be melted even with a small heat input at that time, thus bringing about a result in which gold in the multilayered structural body of copper and gold is preferentially melted. Further, as described in the patent document 5, there can be often formed a ball with a favorable shape if performing bonding under a reductive atmosphere (10% $H_2$—$N_2$). However, oxidation at the time of melting cannot be controlled if performing bonding under an atmosphere not containing hydrogen, thus making it difficult to perform bonding and impossible to form a ball with a favorable shape.

Meanwhile, instead of employing silver or gold, palladium (Pd) can also be conceivably used to coat a surface of a copper wire. In fact, the patent documents 2 through 4 also disclose palladium as a noble meal other than gold and silver used in the coating layers. Here, although the aforementioned documents do not specifically show a superiority of palladium, the truth is that palladium has a melting point (melting point 1554° C.) higher than that of silver and a specific heat (244 J/kg·K) larger than that of gold. Thus, when coated with palladium, there can be conceivably avoided a situation in which a spherical ball fails to be formed due to the fact that the coating layer is melted before the copper wire is melted to form the ball, as is the case in silver and gold. Namely, it is assumed that there can be simultaneously ensured both an oxidation resistivity of copper and the sphericity of the ball by coating the surface of the copper wire with palladium. The patent document 6 discloses how a diffusion layer is provided between a core wire and a coating layer (outer peripheral portion) of a double-layered bonding wire so as to improve an adhesion or the like of the corresponding coating layer. The patent document 6 discloses an example in which copper is employed as the core wire, and palladium is employed as the coating layer. With regard to such a kind of copper bonding wire coated with palladium, oxidation of copper is controlled, thereby not only allowing there to be achieved a superior long-term storageability and wedge bonding property, but also significantly reducing the possibility of oxidation of a ball being formed on a front end of the corresponding bonding wire. Accordingly, there can be formed a spherical ball by simply surrounding the ball with a nitrogen atmosphere prepared using a pure nitrogen gas, without using a hazardous gas such as hydrogen.

PRIOR ARTS

Prior Art Documents

Patent Documents

Patent document 1: Japanese Unexamined Patent Application Publication No. Sho 57-12543
Patent document 2: Japanese Unexamined Patent Application Publication No. Sho 59-181040
Patent document 3: Japanese Unexamined Patent Application Publication No. Sho 61-285743
Patent document 4: Japanese Unexamined Patent Application Publication No. Sho 62-97360

Patent document 5: Japanese Unexamined Patent Application Publication No. Sho 62-120057
Patent document 6: Re-publication of WO2002-23618
Patent document 7: Japanese Unexamined Patent Application Publication No. Sho 59-155161
Patent document 8: Japanese Unexamined Patent Application Publication No. Sho 63-46738
Patent document 9: Japanese Unexamined Patent Application Publication No. Hei 3-32033
Patent document 10: Japanese Unexamined Patent Application Publication No. Hei 4-206646
Patent document 11: Japanese Unexamined Patent Application Publication No. 2003-59963
Patent document 12: Japanese Unexamined Patent Application Publication No. 2004-6740

DISCLOSURE OF THE INVENTION

Problems to be Solved by the Invention

As mentioned earlier, a copper bonding wire with palladium coated on a surface of a copper wire, has been put to practical use as a kind of bonding wire less expensive than a gold bonding wire. However, it has been found that such a kind of copper bonding wire may not necessarily be able to keep up with rapid modifications and diversifications of structure, material and connection technology in a semiconductor mounting in recent years.

For example, although there is often employed a lead frame whose surface is plated with silver, a palladium-plated lead frame has recently been used more often than before. This is because, a conventional lead frame plated with silver (referred to as "silver-plated lead frame" hereunder) has to have a front end thereof thinly plated with a solder (solder plating step) before being soldered to a substrate such as a motherboard or the like, so as to improve a wettability with respect to the solder as much as possible. A high cost is thus incurred due to the solder plating step. Since palladium ensures a higher wettability with respect to the solder than silver, the aforementioned solder plating step can actually be omitted when there is employed a lead frame plated with palladium instead of silver, thus resulting in a low cost.

With regard to the copper bonding wire with palladium coated on the surface of the copper wire, the inventors found that an insufficient wedge bondability was achieved more often and more evidently with respect to the palladium-plated lead frame than the conventional silver-plated lead frame. After considering this problem in detail, the inventors found that palladium on an outermost surface of the corresponding copper bonding wire would come into contact with also palladium on the palladium-plated lead frame at the time of performing wedge bonding. In fact, palladium cannot be easily deformed due to a high hardness thereof (Mohs hardness of palladium is 4.75, while Mohs hardness of copper is 3.0), thus resulting in an insufficient breakage of an oxidized film on the surface of palladium, and consequently contributing to the aforementioned problem. Further, a slow diffusion is effected between palladium on the outermost surface of the bonding wire and palladium on the lead frame, thus resulting in an insufficient diffusion layer between the two palladiums, and consequently contributing to the aforementioned problem also.

A copper bonding wire can conceivably be protected from oxidation by coating a surface of a copper wire with a noble metal less susceptible to oxidation than copper. While metals nobler than copper generally include silver, platinum and gold, an unsatisfactory ball formability is achieved with silver and gold, as mentioned earlier. Platinum, on the other hand, is highly expensive, thus making it difficult to industrially use a copper bonding wire with platinum coated on a surface of a copper wire. For this reason, it is difficult to simultaneously achieve a favorable wedge bondability with respect to the palladium-plated lead frame and an oxidation and sulfuration resistivity, by simply coating the surface of the copper wire with a noble metal (gold, palladium, sliver, platinum).

Further, a wire diameter of a core wire of a bonding wire used in a power device such as a motor or the like through which a large current flows, has to be as large as about 200 μm. Due to such a kind of large diameter, no failure is particularly observed in terms of wedge bonding and ball bonding. In contrast, a wire diameter of a core wire of a bonding wire for LSI is as small as about 15 to 50 μm, thereby causing taints and flaws to be left on a surface of the corresponding bonding wire or negatively impacting a bondability thereof due to a shape of a ball being formed. For this reason, a wedge bondability and a sphericity of the ball are particularly important as for the bonding wire for LSI whose core wire has the wire diameter of about 15 to 50 μm.

In view of the aforementioned problems, it is an object of the present invention to provide a bonding wire for semiconductor, capable of ensuring a favorable wedge bondability even when bonded to a palladium-plated lead frame, superior in oxidation resistivity and having a core wire of copper or a copper alloy.

Means to Solve the Problems

The present invention with the aforementioned objective is summarized as follows.

A bonding wire for semiconductor according to a first aspect, includes: a core wire made of copper or a copper alloy; a coating layer containing palladium, the coating layer being formed on a surface of the core wire, and having a thickness of 10 to 200 nm; and an alloy layer containing noble metal and palladium, the alloy layer being formed on a surface of the coating layer, and having a thickness of 1 to 80 nm, in which the noble metal is gold or silver, and a concentration of the noble metal in the alloy layer is not less than 10% and not more than 75% by volume.

According to a bonding wire for semiconductor as set forth in a second aspect, the noble metal is gold, and a gold concentration in the alloy layer is not less than 15% and not more than 75% by volume.

According to a bonding wire for semiconductor as set forth in a third aspect, the alloy layer contains surface crystal grains among which those having <111> crystal orientations angled at 15 degrees or less to a wire drawing direction occupy an areal percentage of 40% to 100%.

According to a bonding wire for semiconductor as set forth in a fourth aspect, the gold concentration in the alloy layer is not less than 40% and not more than 75% by volume.

According to a bonding wire for semiconductor as set forth in a fifth aspect, the noble metal is silver, the alloy layer is formed to a thickness from 1 nm to 30 nm, and a sliver concentration in the alloy layer is not less than 10% and not more than 70% by volume.

According to a bonding wire for semiconductor as set forth in a sixth aspect, the sliver concentration in the alloy layer is not less than 20% and not more than 70% by volume.

According to a bonding wire for semiconductor as set forth in a seventh aspect, the alloy layer contains surface crystal grains among which those having <100> crystal orientations angled at 15 degrees or less to a wire drawing direction occupy an areal percentage of 50% to 100%.

According to a bonding wire for semiconductor as set forth in an eighth aspect, the alloy layer contains surface crystal grains among which those having <111> crystal orientations angled at 15 degrees or less to a wire drawing direction occupy an areal percentage of 60% to 100%.

According to a bonding wire for semiconductor as set forth in a ninth aspect, a Meyer hardness of a surface of the bonding wire is 0.2 GPa to 2.0 GPa.

According to a bonding wire for semiconductor as set forth in a tenth aspect, the core wire contains at least one of B, P and Se in a total amount of 5 to 300 ppm by mass.

Effects of the Present Invention

The present invention provides an inexpensive bonding wire for a semiconductor device, capable of ensuring a favorable wedge bondability even when bonded to a palladium-plated lead frame, superior in oxidation resistivity and having a core wire of copper or a copper alloy.

MODE FOR CARRYING OUT THE INVENTION

There is further described hereunder a structure of a bonding wire of the present invention. In the following descriptions, "%" refers to "% by volume" unless otherwise noted. Particularly, a composition is studied by analyzing sections of the bonding wire, and is thus presented as a series of average values of only metals. Here, although carbon does exist as a natural impurity (unavoidable impurity), it is not included in the composition described hereunder.

The inventors of the present invention developed a way to provide an inexpensive bonding wire having a core wire of copper or a copper alloy, and capable of ensuring both an oxidation resistivity and a favorable wedge bondability with respect to a lead frame plated with palladium (referred to as "palladium-plated lead frame" hereunder). Specifically, such a kind of bonding wire is obtained by forming on a surface of the core wire of copper or a copper alloy a palladium-containing coating layer of a given thickness, and further forming on a surface of such coating layer a noble metal- and palladium-containing alloy layer of a given thickness and composition. Here, the noble metal in the present invention is either silver or gold.

In the beginning, there is described how the palladium-containing coating layer of an appropriate thickness is formed on the surface of the core wire of copper or a copper alloy. As mentioned earlier, copper or a copper alloy is susceptible to oxidation. Therefore, a poor long-term storageability and wedge bondability is achieved with a bonding wire composed of only copper or a copper alloy. Here, the oxidation of copper can be controlled by forming the palladium-containing coating layer on the surface of the core wire of copper or a copper alloy, thus not only allowing there to be achieved a superior long-term storageability and wedge bondability, but also significantly preventing an oxidation of a ball being formed on a front end of the bonding wire. These effects can be achieved by allowing the coating layer to contain palladium that is less susceptible to oxidation than copper (i.e., a larger heat of oxide formation $\Delta H_O$). In this way, a spherical ball can be formed by only creating a nitrogen atmosphere around the ball using a pure nitrogen gas, without employing a hazardous mixed gas of hydrogen and nitrogen. These effects can be achieved when the thickness of the coating layer is 10 to 200 nm. Here, an insufficient oxidation control effect is achieved when the thickness of the coating layer is less than 10 nm. When the thickness of the coating layer is beyond 200 nm, there are often and unfavorably formed on a surface of the ball bubbles having diameters of several micrometers. Here, elements other than palladium in the palladium-containing coating layer, include unavoidable impurities of palladium, and elements composing the core wire and an outermost surface of the bonding wire. Further, a sufficient oxidation control effect can be achieved when the coating layer contains 50% palladium or more. However, it is preferable that as an element other than palladium in the coating layer, a later-described silver composing the outermost surface of the bonding wire is not included, but a concentration thereof is less than 10% if included. The reason for that is because when the silver concentration is 10% or more, there occurs the aforementioned problems pertaining to a silver-coated wire (e.g., the oxidation while forming the ball). Further, as an element other than palladium in the coating layer, it is preferable that a later-described gold composing the outermost surface of the bonding wire is not included, but a concentration thereof is preferably less than 15% if included. The reason for that is because when the gold concentration is 15% or more, there occurs the aforementioned problems pertaining to a gold-coated wire (e.g., a failure in which the ball is deformed and fails to become a sphere).

There cannot be ensured a favorable wedge bondability with respect to the palladium-plated lead frame, when there is formed only the palladium-containing coating layer on the surface of the core wire of copper or a copper alloy. Here, the inventors discovered that this problem can be solved by further forming on the surface of the coating layer an alloy layer of palladium and silver or an alloy layer of palladium and gold. Such alloy layer further formed on the coating layer is as thick as 1 to 80 nm. This is due to the fact that the wedge bondability is dependent on physical properties within about 3 nm from the outermost surface of the bonding wire. Namely, the alloy of palladium and gold or the alloy of palladium and silver occupies a range of at least 1 nm, preferably 3 nm from the outermost surface of the bonding wire. In this way, silver or gold in the alloy layer composing the outermost surface of the bonding wire, is caused to preferentially diffuse toward palladium on the palladium-plated lead frame on which wedge bonding is performed, thus allowing a new alloy layer to be easily formed between the bonding wire and the palladium-plated lead frame. For this reason, the bonding wire of the present invention has an improved wedge bondability when bonded to the palladium-plated lead frame, and thus having, for example, a favorable 2nd peel strength. This is due to the fact that an interdiffusion between palladium and silver or gold takes place prior to a self-diffusion of palladium. However, when the thickness of the alloy layer is less than 1 nm, the coating layer serving as a base layer of the bonding wire is caused to impact the aforementioned wedge bondability, thus making it impossible to ensure the wedge bondability with respect to the palladium-plated lead frame. Further, when the thickness of the alloy layer is less than 3 nm, the coating layer serving as a base layer of the bonding wire may still negatively impact the wedge bondability, thus making it difficult for the aforementioned effects to be stabilized and consequently bringing about a necessity of forming the corresponding alloy layer into a thickness of, preferably, 3 nm or more. Here, no upper limit is imposed on the thickness of the alloy layer of palladium and silver or the alloy layer of palladium and gold, as far as achieving the aforementioned effects is concerned. However, an upper limit of the thickness of the alloy layer is set to be 80 nm or less in this case in order to ensure a stable quality of the bonding wire. This is because an alloy layer having a thickness of greater than 80 nm has to be formed either through silver or gold plating, or through silver or gold evaporation, and further a temperature of a later-described furnace should be set to be as high as 740° C. or higher. Specifically, such silver or gold plating has to be performed under a high current if performed through a later-described electrolytic plating, and for a long period of time if performed through non-electrolytic plating. In addition, such silver or gold evaporation also has to be performed for a long period of time. Particularly, it is more preferable if the upper limit of the thickness of the alloy layer is 50 nm or less. This is because when the upper limit of the thickness of the alloy layer is 50 nm or less, a heating temperature can be set to be 600 to 650° C.

Further, a silver or gold composition (silver or gold concentration) in the alloy layer needs to be in a specific range in order to achieve the aforementioned effects brought about by the alloy layer of palladium and silver or the alloy layer of palladium and gold. Specifically, the wedge bondability with respect to the palladium-plated lead frame can be improved, when the silver concentration in the alloy layer of palladium and silver or the gold concentration in the alloy layer of palladium and gold is not less than 10% and not more than 75%. Here, the aforementioned effects cannot be achieved if the silver or gold concentration is less than 10%. Further, when the silver or gold concentration is greater than 75%, there is much more likely to be unfavorably formed the deformed ball, as silver alone in the alloy layer of palladium and silver or gold alone in the alloy layer of palladium and gold preferentially melts at the time of forming the ball on the front end of the bonding wire. In contrast, when the silver or gold concentration in the corresponding alloy layer is 75% or less, silver or gold in the corresponding alloy layer of the bonding wire can be evenly mixed with palladium therein, thereby preventing silver or gold alone from preferentially melting when forming the ball on the front end of the bonding wire, thus ensuring a sphericity and a size precision of the ball and eliminating the possibility of forming the deformed ball.

Next, there is described the bonding wire having the coating layer on which the alloy layer of silver and palladium is formed, with further detail.

Such alloy layer further formed on the coating layer is as thick as 1 to 30 nm. This is due to the fact that the wedge bondability is dependent on physical properties within about 3 nm from the outermost surface of the bonding wire. Namely, the alloy of palladium and silver occupies the range of at least 1 nm, preferably 3 nm from the outermost surface of the bonding wire. In this way, silver in the alloy layer composing the outermost surface of the bonding wire, is caused to preferentially diffuse toward palladium on the palladium-plated lead frame on which wedge bonding is performed, thus allowing a new alloy layer to be easily formed between the bonding wire and the palladium-plated lead frame. For this reason, the bonding wire of the present invention has an improved wedge bondability when bonded to the palladium-plated lead frame, and thus having, for example, a favorable 2nd peel strength. This is due to the fact that an interdiffusion between palladium and silver takes place prior to the self-diffusion of palladium. However, when the thickness of the alloy layer is less than 1 nm, the coating layer serving as a base layer of the bonding wire is caused to impact the aforementioned wedge bondability, thus making it impossible to ensure the wedge bondability with respect to the palladium-plated lead frame. Further, when the thickness of the alloy layer is less than 3 nm, the coating layer serving as a base layer of the bonding wire may still negatively impact the wedge bondability, thus making it difficult for the aforementioned effects to be stabilized and consequently bringing about the necessity of forming the corresponding alloy layer into the thickness of, preferably, 3 nm or more. Here, no upper limit is imposed on the thickness of the alloy layer of palladium and silver, as far as achieving the aforementioned effects is concerned. However, an upper limit of the thickness of the alloy layer is set to be 30 nm or less in this case in order to ensure a stable quality of the bonding wire. This is because an alloy layer having a thickness of greater than 30 nm has to be formed when the temperature of the later-described furnace is as higher than 720° C.

Further, a silver composition (silver concentration) in the alloy layer needs to be in a specific range in order to achieve the aforementioned effects brought about by the alloy layer of palladium and silver. Specifically, the wedge bondability with respect to the palladium-plated lead frame can be further improved, when the silver concentration in the alloy layer of palladium and silver is not less than 10% and not more than 70%, preferably, not less than 20% and not more than 70%. Here, the aforementioned effects cannot be achieved if the silver concentration is less than 10%. Further, when the silver concentration is greater than 70%, there is much more likely to be unfavorably formed the deformed ball, as silver alone in the alloy layer of palladium and silver preferentially melts at the time of forming the ball on the front end of the bonding wire. In contrast, when the silver concentration in the corresponding alloy layer is 70% or less, silver in the corresponding alloy layer of the bonding wire can be evenly mixed with palladium therein, thereby preventing silver alone from preferentially melting when forming the ball on the front end of the bonding wire, thus ensuring the sphericity and the size precision of the ball and eliminating the possibility of forming the deformed ball. The sphericity and the size precision of the ball can be further improved when the silver concentration is not less than 10% and not more than 40%.

Accordingly, with regard to the bonding wire of the present invention, the palladium-containing coating layer of an appropriate thickness is formed on the surface of the core wire of copper or a copper alloy, and a silver- and palladium-containing alloy layer of an appropriate thickness and composition is further formed on the surface of the corresponding coating layer, thus ensuring both a favorable wedge bondability with respect to the palladium-plated lead frame and the oxidation resistivity. In addition, the bonding wire of the present invention is inexpensive since the core wire thereof is made of copper or a copper alloy.

Further, it was found that the following effects could also be achieved simultaneously when the silver concentration in the alloy of palladium and silver was not less than 20% and not more than 70%.

In general, during a wire bonding process, a bonding wire is continuously rubbed against an inner wall of the capillary in an area where the bonding wire actually comes into contact with the capillary. Here, the corresponding area on the inner wall of the capillary is smoothened so as to prevent the capillary from leaving scratches (flaws) on the bonding wire.

According to the conventional bonding wire having only the palladium-containing coating layer formed on the core wire of copper or a copper alloy, the area in the capillary where the bonding wire actually comes into contact with the capillary is abraded after, for example, performing a long span wire bonding of over 5 nm for multiple times. As a result, there are formed sharp convexo-concave portions in the corresponding area, thus resulting in noticeable scratches (flaws) left on the surface of the bonding wire by the capillary. This is because the palladium-containing coating layer is hardened due to the fact that palladium itself is a hard metal.

In contrast, according to the present invention, occurrences of the aforementioned sharp convexo-concave portions can be controlled since the silver concentration in the aforementioned alloy layer of silver and palladium is high, such alloy layer being formed on the surface of the coating layer. Silver in the alloy layer of silver and palladium is evenly mixed with palladium therein in a manner of complete solid solution. Here, a high concentration of silver is allowed to preferentially contribute to deformation in the area where the bonding wire comes into contact with the capillary, thereby controlling the occurrences of the aforementioned sharp convexo-concave portions. This effect can be achieved when the silver concentration is not less than 20%, preferably, not less than 30%. Further, there cannot be achieved a sufficient sphericity and size precision of the ball for the aforementioned reasons, when the silver concentration is not less than 70%.

Further, it was found that the following effects could also be achieved simultaneously when the silver concentration in the alloy of palladium and silver was not less than 20%.

According to the conventional bonding wire having only the palladium-containing coating layer formed on the core wire of copper or a copper alloy, the bubbles having diameters of several micrometers may be observed in multiple locations on the surface of a ball formed on the front end of the bonding wire, such ball being formed with a diameter of just over 30 µm. This is due to miniaturization and high functionalization of electronic devices nowadays. Specifically, such miniaturization and high functionalization of electronic devices has also led to miniaturization and high functionalization of semiconductor devices. For this reason, there has been a strong tendency to form a smaller ball on the front end of the bonding wire in order to minimize a bonded area of the corresponding bonding wire. Particularly, while the diameter of the smallest ball that was ever used was slightly shorter than 50 µm, there have been used balls with diameters of just over 30 µm in mass production nowadays. Although the aforementioned minute bubbles of several micrometers were formed on the conventional ball having a diameter of 50 µm or longer, those minute bubbles were actually never considered as problematic due to a bonded area inevitably enlarged by the ball with a large diameter. However, the recent small ball, with a diameter of just over 30 µm, results in a smaller bonded area whose bonding strength and long term-reliability can be negatively affected even by the aforementioned bubbles never questioned before, and thus the bubbles are becoming a problem.

The inventors of the present invention found that those bubbles only existed in palladium. In other words, palladium on the surface of the bonding wire is segregated into the ball during the ball formation, thereby forming a palladium concentrated area as a palladium single layer, and thus causing gas induced by organic substances to be trapped in the corresponding area.

According to the present invention, a specific or higher concentration of silver is contained on the surface of the palladium-containing coating layer, thereby preventing the concentrated area of palladium from being formed when forming the ball, but allowing there to be formed instead a concentrated area of either a silver-palladium alloy or a copper-palladium-silver ternary alloy. Therefore, it is less likely that the organic substance-induced gas may be trapped in the concentrated area of the present invention, thus controlling the occurrences of the bubbles even when forming the ball with a diameter as short as just over 30 µm. Particularly, according to the present invention, the aforementioned effects can be achieved when the silver concentration in the alloy of palladium and silver is 20% or higher, such effects being further favorably improved when the corresponding silver concentration is 30% or higher.

The thicknesses and compositions of the coating layer and the alloy layer can be effectively measured by: sputtering the surface of the bonding wire down toward a depth direction while analyzing results thus obtained; and performing either line or point analysis on a cross-sectional surface of the bonding wire. Measurement through sputtering down toward the depth direction may result in an extremely lengthy measurement time, as a depth measured increases. One of the advantages of the line or point analysis is that concentration distributions on the cross-sectional surface over all or in multiple locations thereon can be reproducibly confirmed with relative ease. While the line analysis can be relatively easily performed on the cross-sectional surface of the bonding wire, an analysis interval for the line analysis can actually be narrowed so as to improve a precision of the corresponding analysis. Particularly, point analysis is equally effective with respect to an enlarged area analyzed in great detail. Here, the thickness of the alloy layer is determined by a range (depth) of a portion ranging from the surface of the bonding wire, such portion having the silver concentration of 10% or higher and being determined through a composition analysis toward the depth direction from the surface of the bonding wire. Further, the thickness of the coating layer is determined by a range (depth) of a portion ranging from an interface of the alloy layer, such portion having a palladium concentration of 50% or higher and being determined through the composition analysis toward the depth direction from the corresponding interface. Analyzers used for the aforementioned analysis include: EPMA (Electron Probe Micro Analysis); EDX (Energy Dispersive X-Ray Analysis); AES (Auger Electron Spectroscopy); TEM (Transmission Electron Microscope) and the like. The effects of the present invention can be achieved when the aforementioned thicknesses and compositions obtained through any one of the aforementioned methods are within the ranges of the present invention.

Further, the inventors discovered that crystal orientations on the surface of the bonding wire, a hardness of the surface of the bonding wire, or kinds and compositions of elements added to the core wire needed to be within specific ranges in order to effectively ensure both the oxidation resistivity and a favorable wedge bondability with respect to the palladium-plated lead frame and to further satisfy a loop property described later.

With regard to the crystal orientations on the surface of the bonding wire, it is preferred that <100> crystal orientations of the surface crystal grains of the alloy layer are not or only slightly angled with respect to a wire drawing direction. Particularly, when the crystal grains whose <100> crystal orientations are angled at 15 degrees or less occupy an areal percentage of 50% to 100% of all the surface crystal grains, it is less likely that crinkles will be formed on a surface of a loop even after performing a reverse bonding. Such effect can be further improved when the corresponding areal percentage is 70% to 100%. Here, the crinkles collectively refer to minute flaws and convexo-concave portions observed on the surface of the loop being formed. In this way, there can be used, for example, an increasingly noticeable method in which ball bonding is performed on a 2nd bonding electrode, and wedge bonding is further performed on a 1st bonding electrode, thereby controlling a loop height, and thus allowing a chip to be made thinner easily.

Specifically, with regard to the aforementioned reverse bonding, ball bonding is at first performed on the 1st bonding electrode followed by cutting the bonding wire immediately above the ball bonded thereon. Subsequently, ball bonding is also performed on the 2nd bonding electrode followed by finally performing wedge bonding with respect to the ball bonded on the 1st bonding electrode earlier. Here, the crinkles may be formed on the surface of the bonding wire due to a large impact applied thereto at the time of cutting the corresponding bonding wire immediately above the ball bonded on the 1st bonding electrode through ball bonding. Further, the aforementioned crinkles may accelerate occurrences of cracks due to a long-term thermal fatigue of a device, such thermal fatigue being caused by heating due to the usage of the device and cooling to the room temperature upon powering off the device.

The inventors of the present invention deliberately concluded that the aforementioned crinkle failure was related to the crystal orientations on the surface (alloy layer) of the bonding wire. Specifically, the inventors found that the crinkles were noticeably formed when the aforementioned crystal orientations were those with high strengths but poor ductilities, as represented by <111> crystal orientations. As a result of further consideration, the inventors found that the crinkles could be controlled by minimizing angles at which the <100> crystal orientations were angled with respect to the wire drawing direction, and that a ductility sufficient for controlling the crinkles could particularly be achieved when the crystal grains whose <100> crystal orientations are angled at 15 degrees or less occupy an areal percentage of 50% or more. However, these effects cannot be achieved when the crystal grains whose <100> crystal orientations are angled at 15 degrees or less occupy an areal percentage of less than 50%. Here, the angles at which the <100> crystal orientations are angled with respect to the wire drawing direction on the surface of the alloy layer, can be measured by micro focused X-ray diffraction technique using TEM or Electron Backscattered Diffraction (EBSD) method or the like. Particularly, the EBSD method is more preferable because it can be used to observe the crystal orientations of individual crystal grains, and further graphically shows angular differences between the crystal orientations observed at neighboring points of measurement. Further, the EBSD method can be used to relatively easily observe the angles of the crystal grains with precision, even in the case of a thin wire such as the bonding wire. Further, an area formed by the crystal grains having the aforementioned angles of 15 degrees or less can be calculated using micro focused X-ray diffraction technique as a volume ratio of the crystal orientations based on X-ray strengths of the crystal orientations of the individual crystal grains. The corresponding area can also be directly obtained based on the crystal orientations of the individual crystal grains observed through EBSD. The aforementioned areal percentage is calculated by observing the area, such area being any area on the surface of the bonding wire, having a length of at least ¼ of a diameter of the bonding wire in a direction perpendicular to the wire drawing direction of the bonding wire, and having a at least 100 µm length in the wire drawing direction of the bonding wire. The ratio is expressed in percentage of the area where the crystal grains have the aforementioned angles of 15 degrees or less, with respect to the observed area assumed as 100%. The effects of the present invention can be achieved when the aforementioned thicknesses and compositions obtained through any one of the aforementioned methods are within the ranges of the present invention.

With regard to the crystal orientations on the surface of the bonding wire, it is preferred that the <111> crystal orientations of the surface crystal grains of the alloy layer are not or only slightly angled with respect to the wire drawing direction. Particularly, when the crystal grains having the aforementioned angles of 15 degrees or less occupy an areal percentage of 60% to 100%, it is less likely that leaning failures may occur even after performing a special bonding featuring a loop height of 300 µm or higher, such leaning failures being failures in which the loop leans toward a direction perpendicular to a wire-bonding direction. Such effect can be further improved when the corresponding areal percentage is 70% to 100%. This is because a strength and elastic modulus are improved when the crystal orientations are the <111> crystal orientation or the neighborhood thereof. As a result of further consideration, the inventors found that a rate of occurrences of the leaning failures could be controlled by minimizing angles at which the <111> crystal orientations were angled with respect to the wire drawing direction on the surface of the bonding wire, and that a strength and elastic modulus sufficient for controlling the rate of occurrences of the leaning failures could particularly be achieved when the crystal grains having the aforementioned angles of 15 degrees or less occupy an areal percentage of 40% or more. However, the rate of occurrences of the leaning failures cannot be sufficiently controlled when the crystal grains having the aforementioned angles of 15 degrees or less occupy an areal percentage of less than 50%. Here, the angles at which the <111> crystal orientations are angled with respect to the wire drawing direction on the surface of the alloy layer, can be measured by micro focused X-ray diffraction technique using TEM or Electron Backscattered Diffraction (EBSD) method or the like. Particularly, the EBSD method is more preferable because it can be used to observe the crystal orientations of individual crystal grains, and further graphically shows angular differences between the crystal orientations observed at neighboring points of measurement. Further, the EBSD method can be used to relatively easily observe the angles of the crystal grains with precision, even in the case of a thin wire such as the bonding wire. Further, the area formed by the crystal grains having the aforementioned angles of 15 degrees or less can be calculated using micro focused X-ray diffraction technique as a volume ratio of the crystal orientations based on X-ray strengths of the crystal orientations of the individual crystal grains. The corresponding area can also be directly obtained based on the crystal orientations of the individual crystal grains observed through EBSD. The aforementioned areal percentage is calculated by observing the area, such area being any area on the surface of the bonding wire, having a length of at least ¼ of a diameter of the bonding wire in a direction perpendicular to the wire drawing direction of the bonding wire, and having a at least 100 µm length in the wire drawing direction of the bonding wire. The ratio is expressed in percentage of the area where the crystal grains have the aforementioned angles of 15 degrees or less, with respect to the observed area assumed as 100%. The effects of the present invention can be achieved when the aforementioned thicknesses and compositions obtained through any one of the aforementioned methods are within the ranges of the present invention.

With regard to the hardness of the surface of the bonding wire, the Meyer hardness of the surface of the bonding wire is preferably set to be 0.2 to 2.0 GPa, thereby controlling an occurrence of a failure called neck damage even when performing a low loop bonding featuring a loop height of about 80 µm.

The neck damage refers to a damage observed in a boundary portion (neck portion) between the ball and a base part of the bonding wire, and is a type of failure caused by an excessive load applied to the neck portion when forming the loop with a significantly low loop height. Thin electronic devices such as flash memory devices or the like nowadays, employ thin devices with a plurality of thin silicon chips mounted thereon in order to maximize memory storage capacities as much as possible. Conventionally, such thin devices inevitably cause the corresponding loop heights to be made short, thus allowing the aforementioned neck damage to occur easily.

The inventors disclosed that the occurrence of the neck damage was closely associated with the hardness of the surface of the bonding wire, and found that the neck damage could be controlled by lowering a degree of the corresponding hardness so as to enable the surface of the bonding wire to plastically deform even when an excessive load is being applied to the neck portion during the low loop bonding. Particularly, the aforementioned effect can be achieved when the Meyer hardness of the surface of the bonding wire is 2.0 GPa or lower. However, the hardness of the surface of the bonding wire becomes close to that of a normal silver alloy when the Meyer hardness thereof is greater 2.0 GPa, thereby preventing a surface layer from sufficiently undergoing plastic deformation when an excessive load is being applied to the neck portion during the low loop bonding, thus preventing the aforementioned effect from being achieved. In contrast, the Meyer hardness of lower than 0.2 GPa leads a significantly low degree of hardness of the surface of the bonding wire, thereby causing flaws to be easily left on the surface of the bonding wire being handled, and even more surface flaws to occur depending on how the bonding wire is being handled. Here, the Meyer hardness refers to a hardness measured using a steel ball indenter or a cemented carbide ball indenter. Specifically, the Meyer hardness refers to a value obtained by dividing a load of the indenter producing an indentation on a test surface, by a projected area diameter of the permanent indentation, such value having the dimension of stress. The Mayer hardness at a depth of about 1 nm can be measured through a nanoindentation method which is an analytical method for a material surface. For this reason, the Meyer hardness of the present invention is preferably measured through the nanoindentation method. Further, the Meyer hardness of the surface of the bonding wire can be measured by applying the nanoindentation method to the outermost surface of the bonding wire having the alloy layer and the coating layer. Here, a Meyer hardness of 0.2 to 2.0 GPa is equivalent to a Vickers hardness of about 50 to 570 Hv.

With regard to the kinds and compositions of the elements added to the core wire, although the core wire of the present invention is made of either copper or a copper alloy, various kinds of elements can be added thereto as long as the effects of the present invention are not undermined. The elements that can be added to the core wire include Ca, B, P, Al, Ag, Se and the like. Among these elements, it is preferred that at least one of B, P and Se is contained. The strength of the bonding wire can be further improved when a total amount of the elements added is 5 to 300 mass ppm. As a result, there can be ensured a linearity of the loop even after performing, for example, a long bonding featuring a loop length of longer than 5 mm. This is due to the fact that the elements added contribute to solid-solution strengthening or grain boundary strengthening in copper crystal grains of the core wire. However, the aforementioned strength cannot be further improved when a concentration of the elements added is less than 5 mass ppm. In contrast, the ball will be overly hardened when the concentration of the elements added is greater than 300 mass ppm, thereby unfavorably increasing a likelihood of damaging the chip when performing ball bonding. A component content of the core wire can be effectively analyzed by: cutting the bonding wire followed by, for example, sputtering a cross-sectional surface thus formed down toward a depth direction while analyzing results thus obtained; and performing either line or point analysis on the corresponding cross-sectional surface. Measurement through sputtering down toward the depth direction may result in an extremely lengthy measurement time, as a depth measured increases. One of the advantages of the line or point analysis is that concentration distributions on the cross-sectional surface over all or in multiple locations thereon can be reproducibly confirmed with relative ease. While the line analysis can be relatively easily performed on the cross-sectional surface of the bonding wire, an analysis interval for the line analysis can actually be narrowed so as to improve a precision of the corresponding analysis. Particularly, point analysis is equally effective with respect to an enlarged area analyzed in great detail. Analyzers used for the aforementioned analysis include: EPMA; EDX; AES; TEM and the like. Further, as a method for examining an overall average component, there can be used the method in which the bonding wire is dissolved from the surface thereof in stages by a chemical solution such as an acid or the like applied to the surface, and the component in a dissolved portion is obtained based on concentrations in the solution applied. The effects of the present invention can be achieved when the aforementioned thicknesses and compositions obtained through any one of the aforementioned methods are within the ranges of the present invention.

Other than the favorable examples of the present invention described above, there can be made appropriate modifications to the present invention. For example, there may be formed a diffusion layer between the core wire and the coating layer. Particularly, such diffusion layer can be a diffusion layer having a palladium-containing area successively provided next to the coating layer, and containing less than 50% palladium which is diffused in the corresponding diffusion layer along with copper composing the core wire. Such a kind of diffusion layer allows an adhesion between the coating layer and the core wire of the bonding wire to improve.

Next, there is described the bonding wire having the coating layer on which the alloy layer of gold and palladium is formed. Such alloy layer further formed on the coating layer is as thick as 1 to 80 nm. This is due to the fact that the wedge bondability is dependent on physical properties within about 3 nm from the outermost surface of the bonding wire. Namely, the alloy of palladium and gold occupies the range of at least 1 nm, preferably 3 nm from the outermost surface of the bonding wire. In this way, gold in the alloy layer composing the outermost surface of the bonding wire, is caused to preferentially diffuse toward palladium on the palladium-plated lead frame on which wedge bonding is performed, thus allowing a new alloy layer to be easily formed between the bonding wire and the palladium-plated lead frame. For this reason, the bonding wire of the present invention has an improved wedge bondability when bonded to the palladium-plated lead frame, and thus having, for example, a favorable 2nd peel strength. This is due to the fact that an interdiffusion between palladium and gold takes place prior to the self-diffusion of palladium. However, when the thickness of the alloy layer is less than 1 nm, the coating layer serving as a base layer of the bonding wire is caused to impact the aforementioned wedge bondability, thus making it impossible to ensure the wedge bondability with respect to the palladium-plated lead frame. Further, when the thickness of the alloy layer is less than 3 nm, the coating layer serving as a base layer of the bonding wire may still negatively impact the wedge bondability, thus making it difficult for the aforementioned effects to be stabilized and consequently bringing about the necessity of forming the corresponding alloy layer into the thickness of, preferably, 3 nm or more. Here, no upper limit is imposed on the thickness of the alloy layer of palladium and gold, as far as achieving the aforementioned effects is concerned However, an upper limit of the thickness of the alloy layer is set to be 80 nm or less in this case in order to ensure a stable quality of the bonding wire. This is because an alloy layer having a thickness of greater than 80 nm has to be formed either through gold plating, or through gold evaporation, and further a heating temperature in a later-described heating treatment should be set to be as high as 700° C. or higher. Specifically, such gold plating has to be performed under a high current if performed through a later-described electrolytic plating, and for a long period of time if performed through non-electrolytic plating. In addition, such gold evaporation also has to be performed for a long period of time. Particularly, it is more preferable if the upper limit of the thickness of the alloy layer is 50 nm or less. This is because when the upper limit of the thickness of the alloy layer is 50 nm or less, the heating temperature can be set to be 600 to 650° C.

Further, a gold composition (gold concentration) in the alloy layer needs to be in a specific range in order to achieve the aforementioned effects brought about by the alloy layer of palladium and gold. Specifically, the wedge bondability with respect to the palladium-plated lead frame can be further improved, when the gold concentration in the alloy layer of palladium and gold is not less than 15% and not more than 75%, more preferably, not less than 40% and not more than 75%. Here, the aforementioned effects cannot be achieved if the gold concentration is less than 15%. Further, when the gold concentration is greater than 75%, there is much more likely to be unfavorably formed the deformed ball, as gold alone in the alloy layer of palladium and gold preferentially melts at the time of forming the ball on the front end of the bonding wire. This is associated with the following. As mentioned earlier, copper is only partially melted due to the high thermal conductivity (401 W/m·K) and the property of easily removing heat while gold with a low thermal conductivity (317 W/m·K) causes heat to be easily trapped therein when heating and melting the front end of the bonding wire through an arc heat input. In contrast, when the gold concentration in the corresponding alloy layer is 75% or less, gold in the corresponding alloy layer of the bonding wire can be evenly mixed with palladium therein, thereby preventing gold alone from preferentially melting when forming the ball on the front end of the bonding wire, thus ensuring the sphericity and the size precision of the ball and eliminating the possibility of forming the deformed ball. Particularly, the sphericity and the size precision of the ball can be further improved when the gold concentration is not less than 15% but less than 40%.

Accordingly, with regard to the bonding wire of the present invention, the palladium-containing coating layer of a given thickness is formed on the surface of the core wire of copper or a copper alloy, and a gold- and palladium-containing alloy layer of a given thickness and composition is further formed on the surface of the corresponding coating layer, thus ensuring a favorable wedge bondability with respect to the palladium-plated lead frame, the oxidation resistivity and a sulfuration resistivity. In addition, the bonding wire of the present invention is inexpensive since the core wire thereof is made of copper or a copper alloy.

The thicknesses and compositions of the coating layer and the alloy layer can be measured by: sputtering the surface of the bonding wire down toward a depth direction while analyzing results thus obtained; and performing either line or point analysis on a cross-sectional surface of the bonding wire. Here, the thickness of the alloy layer is determined by a range (depth) of a portion ranging from the surface of the bonding wire, such portion having the gold concentration of 15% or higher and being determined through a composition analysis toward the depth direction from the surface of the bonding wire. Further, the thickness of the coating layer is determined by a range (depth) of a portion ranging from an interface of the alloy layer, such portion having a palladium concentration of 50% or higher and being determined through the composition analysis toward the depth direction from the corresponding interface. Analyzers used for the aforementioned analysis include: EPMA (Electron Probe Micro Analysis); EDX (Energy Dispersive X-Ray Analysis); AES (Auger Electron Spectroscopy); TEM (Transmission Electron Microscope) and the like. The effects of the present invention can be achieved when the aforementioned thicknesses and compositions obtained through any one of the aforementioned methods are within the ranges of the present invention.

Further, the inventors discovered that crystal orientations on the surface of the bonding wire, the hardness of the surface of the bonding wire, or kinds and compositions of elements added to the core wire needed to be within specific ranges in order to effectively ensure both the oxidation resistivity and a favorable wedge bondability with respect to the palladium-plated lead frame and to further satisfy a loop property described later.

With regard to the crystal orientations on the surface of the bonding wire, it is preferred that the <111> crystal orientations of the surface crystal grains of the alloy layer are not or only slightly angled with respect to the wire drawing direction. Particularly, when the crystal grains having the aforementioned angles of 15 degrees or less occupy an areal percentage of 60% to 100%, it is less likely that leaning failures may occur even after performing the special bonding featuring a loop height of 300 μm or higher, such leaning failures being failures in which the loop leans toward the direction perpendicular to the wire-bonding direction. Such effect can be further improved when the corresponding areal percentage is 70% to 100%. This is because a strength and elastic modulus are improved when the crystal orientations are the <111> crystal orientation or the neighborhood thereof. As a result of further consideration, the inventors found that the rate of occurrences of the leaning failures could be controlled by minimizing angles at which the <111> crystal orientations were angled with respect to the wire drawing direction on the surface of the bonding wire, and that the strength and elastic modulus sufficient for controlling the rate of occurrences of the leaning failures could particularly be achieved when the crystal grains having the aforementioned angles of 15 degrees or less occupy an areal percentage of 60% or more. However, the rate of occurrences of the leaning failures cannot be sufficiently controlled when the crystal grains having the corresponding angles of 15 degrees or less occupy an areal percentage of less than 60%. Here, the angles at which the <111> crystal orientations are angled with respect to the wire drawing direction on the surface of the alloy layer, can be measured by micro focused X-ray diffraction technique using TEM or Electron Backscattered Diffraction (EBSD) method or the like. Particularly, the EBSD method is more preferable because it can be used to observe the crystal orientations of individual crystal grains, and further graphically shows angular differences between the crystal orientations observed at neighboring points of measurement. Further, the EBSD method can be used to relatively easily observe the angles of the crystal grains with precision, even in the case of a thin wire such as the bonding wire. Further, the area formed by the crystal grains having the aforementioned angles of 15 degrees or less can be calculated using micro focused X-ray diffraction technique as a volume ratio of the crystal orientations based on X-ray strengths of the crystal orientations of the individual crystal grains. The corresponding area can also be directly obtained based on the crystal orientations of the individual crystal grains observed through EBSD. The aforementioned areal percentage is calculated by observing the area, such area being any area on the surface of the bonding wire, having a length of at least ¼ of a diameter of the bonding wire in a direction perpendicular to the wire drawing direction of the bonding wire, and having a at least 100 μm length in the wire drawing direction of the bonding wire. The ratio is expressed in percentage of the area where the crystal grains have the aforementioned angles of 15 degrees or less, with respect to the observed area assumed as 100%. The effects of the present invention can be achieved when the aforementioned thicknesses and compositions obtained through any one of the aforementioned methods are within the ranges of the present invention.

With regard to the hardness of the surface of the bonding wire, the Meyer hardness of the surface of the bonding wire is preferably set to be 0.2 to 2.0 GPa, thereby controlling the occurrence of the failure called neck damage even when performing the low loop bonding featuring the loop height of about 80 μm.

The neck damage refers to the damage observed in the boundary portion (neck portion) between the ball and the base part of the bonding wire, and is the type of failure caused by an excessive load applied to the neck portion when forming the loop with a significantly low loop height. Thin electronic devices such as flash memory devices or the like nowadays, employ thin devices with a plurality of thin silicon chips mounted thereon in order to maximize memory storage capacities as much as possible. Conventionally, such thin devices inevitably cause the corresponding loop heights to be made short, thus allowing the aforementioned neck damage to occur easily.

The inventors disclosed that the occurrence of the neck damage was closely associated with the hardness of the surface of the bonding wire, and found that the neck damage could be controlled by lowering the degree of the corresponding hardness so as to enable the surface of the bonding wire to plastically deform even when an excessive load is being applied to the neck portion during the low loop bonding. Particularly, the aforementioned effect can be achieved when the Meyer hardness of the surface of the bonding wire is 2.0 GPa or lower. However, the hardness of the surface of the bonding wire becomes close to that of a normal gold alloy when the Meyer hardness thereof is greater 2.0 GPa, thereby making it difficult for the surface layer to undergo plastic deformation when an excessive load is being applied to the neck portion during the low loop bonding, thus preventing the aforementioned effect from being sufficiently achieved. In contrast, the Meyer hardness of lower than 0.2 GPa leads a significantly low degree of hardness of the surface of the bonding wire, thereby causing flaws to be easily left on the surface of the bonding wire being handled, and even more surface flaws to occur depending on how the bonding wire is being handled. Here, the Meyer hardness refers to a hardness measured using a steel ball indenter or a cemented carbide ball indenter. Specifically, the Meyer hardness refers to a value obtained by dividing a load of the indenter producing an indentation on a test surface, by a projected area diameter of the permanent indentation, such value having the dimension of stress. The Mayer hardness at a depth of about 1 nm can be measured through a nanoindentation method which is an analytical method for a material surface. For this reason, the Meyer hardness of the present invention is preferably measured through the nanoindentation method. Further, the Meyer hardness of the surface of the bonding wire can be measured by applying the nanoindentation method to the outermost surface of the bonding wire having the alloy layer and the coating layer. Here, a Meyer hardness of 0.2 to 2.0 GPa is equivalent to a Vickers hardness of about 50 to 570 Hv.

With regard to the kinds and compositions of the elements added to the core wire, although the core wire of the present invention is made of either copper or a copper alloy, various kinds of elements can be added thereto as long as the effects of the present invention are not undermined. The elements that can be added to the core wire include Ca, B, P, Al, Ag, Se and the like. Among these elements, it is preferred that at least one of B, P and Se is contained. The strength of the bonding wire can be further improved when the total amount of the elements added is 5 to 300 mass ppm. As a result, there can be ensured the linearity of the loop even after performing, for example, the long bonding featuring the loop length of longer than 5 mm. This is due to the fact that the elements added contribute to solid-solution strengthening or grain boundary strengthening in copper crystal grains of the core wire. However, the aforementioned strength cannot be further improved when the concentration of the elements added is less than 5 mass ppm. In contrast, the ball will be further hardened when the concentration of the elements added is greater than 300 mass ppm, thereby unfavorably increasing the likelihood of damaging the chip when performing ball bonding. A component content of the core wire can be effectively analyzed by: cutting the bonding wire followed by, for example, sputtering the cross-sectional surface thus formed down toward the depth direction while analyzing results thus obtained; and performing either line or point analysis on the corresponding cross-sectional surface. Analyzers used for the aforementioned analysis include: EPMA; EDX; AES; TEM and the like. Further, a method for examining an overall average component, there can be used the method in which the bonding wire is dissolved from the surface thereof in stages by a chemical solution such as an acid or the like applied to the surface, and the component in a dissolved portion is obtained based on concentrations in the solution applied. The effects of the present invention can be achieved when the aforementioned thicknesses and compositions obtained through any one of the aforementioned methods are within the ranges of the present invention.

Other than the favorable examples of the present invention described above, there can be made appropriate modifications to the present invention. For example, there may be formed the diffusion layer between the core wire and the coating layer. Particularly, such diffusion layer can be the diffusion layer having the palladium-containing area successively provided next to the coating layer, and containing less than 50% palladium which is diffused in the corresponding diffusion layer along with copper composing the core wire. Such a kind of diffusion layer allows the adhesion between the coating layer and the core wire of the bonding wire to improve.

There is described, hereunder, an example of a manufacturing method of the bonding wire of the present invention.

In the beginning, there is described a manufacturing method of the bonding wire having the coating layer on which the alloy layer of silver and palladium is formed.

The bonding wire having the aforementioned composition is manufactured as follows. At first, there is weighed as a starting material a high-purity copper (with a purity of 99.99% or higher) or a mixture of such high-purity copper and the elements added thereto, followed by heating and melting such high-purity copper or mixture under high vacuum or an inert atmosphere such as Ar or the like, thus obtaining an ingot of copper or a copper alloy. Metallic dies are then successively used to draw the ingot to a diameter of the core wire eventually required. The palladium-containing coating layer of the present invention is formed after the diameter of the core wire has been drawn to an eventually reaching required length. The palladium-containing coating layer can be formed through electrolytic plating, non-electrolytic plating, evaporation method or the like. Particularly, it is industrially most preferable that the coating layer is formed through electrolytic plating which allows the thickness thereof to be stably controlled. Subsequently, there is formed on the surface of the coating layer the alloy composed of silver and palladium. Such alloy can be formed through any kinds of method including, for example, a method in which a silver film is formed on the surface of the coating layer as a skin layer after the corresponding coating layer has been formed first, followed by continuously dragging the bonding wire thus obtained through an electric furnace maintained at a given temperature so as to facilitate alloying, thus favorably and severely controlling a composition and thickness of the corresponding alloy. Particularly, it is preferred that heating is carried out at a temperature of 180 to 210° C., for 15 to 24 hours, in order to avoid oxidation and sulfuration during alloying. Here, the aforementioned silver film can be formed on the surface of the coating layer through electrolytic plating, non-electrolytic plating, evaporation or the like. Further, it is also industrially most preferable that the silver film is formed through electrolytic plating for the reasons mentioned above. Since silver can be easily sulfurated when heated during alloying, an inert atmosphere such as nitrogen, Ar or the like is employed as an atmosphere inside the aforementioned furnace, and a sulfur concentration in the corresponding atmosphere is set to be 900 ppm or lower unlike a method for heating the conventional bonding wire. More preferably, a reducing gas such as hydrogen or the like is mixed into the aforementioned inert gas by at least 100 ppm, thus more effectively preventing the bonding wire from being sulfurated. Most preferably, a second atmosphere furnace serving as an additional layer is provided outside an atmosphere furnace (a first atmosphere furnace) so as to avoid, as much as possible, a contamination of an impurity gas such as sulfur or the like from outside the equipment. Particularly, such impurity gas cannot easily reach the first atmosphere furnace even when a minute amount of the corresponding impurity gas has entered the second atmosphere furnace from the outside. Further, although an appropriate temperature inside the furnace varies depending on the composition of the bonding wire and a speed at which the corresponding bonding wire is dragged, the bonding wire with a stable quality can be favorably obtained when the aforementioned temperature is about 230 to 270° C. Furthermore, a stable operability can be favorably achieved if the bonding wire is dragged during a drawing process at a speed of about 40 to 80 m/min, for example.

According to the manufacturing method of the bonding wire of the present invention, a special method is required to allow the crystal grains with the <100> crystal orientations angled at 15 degrees or less to the wire drawing direction, to occupy an areal percentage of 50 to 100%, which would otherwise be difficult if employing a normal method.

Particularly, using the same method as above, the palladium-containing coating layer is formed on the aforementioned ingot after the corresponding ingot has been obtained through the aforementioned procedures. The silver film is further formed thereon through the aforementioned procedures. The ingot thus coated with the coating layer and the silver film is then drawn to the core wire with the diameter eventually required, through the metallic dies. Specifically, such ingot is drawn at reduction rates of about 11 to 19% in areas of the dies when the aforementioned wire diameter is 80 µm or longer, and at reduction rates of about 7 to 17% in areas of the dies when the corresponding diameter is less than 80 µm, such reduction rates being larger than usual. In this way, there can be developed on the silver film an aggregate structure having a directional property (an aggregate structure with the corresponding crystal orientations pointed to the wire drawing direction). However, the bonding wire drawn at a large reduction rate is highly susceptible to breakage. Therefore, the bonding wire is more preferably drawn at a speed as low as, for example, 4 to 8 m/min in order to avoid the breakage of the bonding wire, such speed being lower than a normal speed at which the bonding wire is drawn. The bonding wire thus drawn is also heated so as to facilitate alloying. When a low temperature is used to heat the bonding wire drawn so as to facilitate alloying, the crystal grains with the <100> crystal orientations angled at 15 degrees or less to the wire drawing direction occupy a high areal percentage. When the corresponding temperature is high, the aforementioned crystal grains occupy a low areal percentage. Such low areal percentage is associated with the fact that the aforementioned aggregate structure is more likely to lose the directional property thereof when heated and with recrystallization facilitated thereupon. Particularly, the aforementioned areal percentage can be controlled based on the heating temperature, such areal percentage reaching 100% when the temperature inside the furnace is 230 to 280° C., and reaching about 50% when the temperature inside the furnace is 680 to 720° C.

According to the manufacturing method of the bonding wire of the present invention, a special method is required to allow the crystal grains with the <111> crystal orientations angled at 15 degrees or less to the wire drawing direction to occupy an areal percentage of 50 to 100%, which would otherwise be difficult if employing the normal method.

Particularly, using the same method as above, the palladium-containing coating layer is formed on the aforementioned ingot after the corresponding ingot has been obtained through the aforementioned procedures. The silver film is further formed thereon through the aforementioned procedures. The ingot thus coated with the coating layer and the silver film is then drawn to the core wire with the diameter eventually required, through the metallic dies. Specifically, such ingot is drawn at reduction rates of about 20 to 22% in areas of the dies when the aforementioned wire diameter is 150 µm or longer, at slightly larger reduction rates of about 18 to 19% in areas of the dies when the corresponding diameter is not less than 80 µm but less than 150 µm, and again at the high reduction rates of about 20 to 22% in areas of the dies when the corresponding diameter is less than 80 µm. In this way, there can be developed on the silver film the aggregate structure having the directional property (the aggregate structure with the corresponding crystal orientations pointed to the wire drawing direction). However, the bonding wire drawn at a large reduction rate is highly susceptible to breakage. Therefore, the bonding wire is more preferably drawn at a speed as low as, for example, 1 to 3 m/min in order to avoid the breakage of the bonding wire, such speed being lower than the normal speed at which the bonding wire is drawn. The bonding wire thus drawn is also heated so as to facilitate alloying. When a low temperature is used to heat the bonding wire drawn so as to facilitate alloying, the crystal grains with the <100> crystal orientations angled at 15 degrees or less to the wire drawing direction occupy a high areal percentage. When the corresponding temperature is high, the crystal grains with the <100> crystal orientations angled at 15 degrees or less to the wire drawing direction occupy a low areal percentage. Such low areal percentage is associated with the fact that the aforementioned aggregate structure is more likely to lose the directional property thereof when heated and with recrystallization facilitated thereupon. Particularly, the aforementioned areal percentage can be controlled based on the heating temperature, such areal percentage being 50% when the temperature inside the furnace is 680 to 720° C., greater than 50% but less than 70% when the temperature inside the furnace is 720 to 740° C., and not less than 70% when the temperature inside the furnace is 740 to 750° C.

According to the manufacturing method of the bonding wire of the present invention, a special method is required to manufacture the bonding wire having the coating layer whose surface is as hard as 0.2 to 2.0 GPa in terms of the Meyer hardness, which would otherwise be difficult if employing the normal method. Namely, such special method allows the alloy of palladium and silver on the surface of the bonding wire to be formed particularly soft and then the bonding wire to be manufactured. Specifically, the corresponding bonding wire can be manufactured by: performing drawing until the diameter thereof has reached a desired length through any one of the aforementioned methods; heating the bonding wire thus drawn so as to facilitate alloying; and placing each spool of the bonding wire thus heated in the electric furnace under the atmosphere of argon, so as to further heat the bonding wire at a temperature of 150 to 200° C., for 20 to 24 hours. The alloy of palladium and silver cannot be formed particularly soft as described above if the heating is carried out at a temperature lower than 150° C. or for a time period shorter than 20 hours. However, if the heating is carried out at a temperature higher than 200° C. or for a time period longer than 24 hours, diffusions among neighboring bonding wires are facilitated, thus possibly causing the corresponding bonding wires to stick to one another.

Next, there is described a manufacturing method of the bonding wire having the coating layer on which the alloy layer of gold and palladium is formed.

The bonding wire having the aforementioned composition is manufactured as follows. At first, there is weighed as the starting material the high-purity copper (with the purity of 99.99% or higher) or the mixture of such high-purity copper and the elements added thereto, followed by heating and melting such high-purity copper or mixture under high vacuum or an inert atmosphere such as Ar or the like, thus obtaining the ingot of copper or a copper alloy. Metallic dies are then successively used to draw the ingot a diameter of the core wire eventually required. The palladium-containing coating layer of the present invention is formed after the diameter of the core wire has been drawn to an eventually required length. The palladium-containing coating layer can be formed through electrolytic plating, non-electrolytic plating, evaporation method or the like. Particularly, it is industrially most preferable that the coating layer is formed through electrolytic plating which allows the thickness thereof to be stably controlled. Subsequently, there is formed on the surface of the coating layer the alloy layer composed of gold and palladium. Such alloy can be formed through any kinds of method including, for example, a method in which a gold film is formed on the surface of the coating layer as a skin layer after the corresponding coating layer has been formed first, followed by continuously dragging the bonding wire thus obtained through the electric furnace maintained at a given temperature so as to facilitate alloying, thus favorably and severely controlling a composition and thickness of the corresponding alloy. Particularly, it is preferred that the heating is carried out at a temperature of 160 to 190° C., for 16 to 25 hours, in order to avoid oxidation during alloying. Here, the aforementioned gold film can be formed on the surface of the coating layer through electrolytic plating, non-electrolytic plating, evaporation or the like. Further, it is also industrially most preferable that the gold film is formed through electrolytic plating for the reasons mentioned above. Since a raw material of the bonding wire may be contaminated, Ar or the like is employed as an atmosphere inside the aforementioned furnace, and an oxygen concentration in the corresponding atmosphere is set to be 5000 ppm or lower unlike the method for heating the conventional bonding wire. More preferably, a reducing gas such as hydrogen or the like is mixed into the aforementioned inert gas by at least 500 ppm, thus more effectively preventing the raw material of the bonding wire from being contaminated. Further, although the appropriate temperature inside the furnace varies depending on the composition of the bonding wire and the speed at which the corresponding bonding wire is dragged, the bonding wire with a stable quality can be favorably obtained when the aforementioned temperature is about 210 to 700° C. Furthermore, a stable operability can be favorably achieved if the bonding wire is dragged during the drawing process at a speed of about 20 to 40 m/min, for example.

According to the manufacturing method of the bonding wire of the present invention, a special method is required to allow the crystal grains with the <111> crystal orientations angled at 15 degrees or less to the wire drawing direction, to occupy an areal percentage of 50 to 100%, which would otherwise be difficult if employing the normal method.

Particularly, using the same method as above, the palladium-containing coating layer is formed on the aforementioned ingot after the corresponding ingot has been obtained through the aforementioned procedures. The gold film is further formed thereon through the aforementioned procedures. The ingot thus coated with the coating layer and the gold film is then drawn to the core wire with the diameter eventually required, through the metallic dies. Specifically, such ingot is drawn at reduction rates of about 14 to 21% in areas of the dies when the aforementioned wire diameter is 150 μm or longer, and at reduction rates of about 12 to 19% in areas of the dies when the corresponding diameter is less than 150 μm, such reduction rates being larger than usual. In this way, there can be developed on the gold film the aggregate structure having the directional property (the aggregate structure with the corresponding crystal orientations pointed to the wire drawing direction). However, the bonding wire drawn at a large reduction rate is highly susceptible to breakage. Therefore, the bonding wire is more preferably drawn at a speed as low as, for example, 2 to 4 m/min in order to avoid the breakage of the bonding wire, such speed being lower than the normal speed at which the bonding wire is drawn. The bonding wire thus drawn is also heated so as to facilitate alloying. When a low temperature is used to heat the bonding wire drawn so as to facilitate alloying, the crystal grains with the <111> crystal orientations angled at 15 degrees or less to the wire drawing direction occupy a high areal percentage. When the corresponding temperature is high, the crystal grains with the <111> crystal orientations angled at 15 degrees or less to the wire drawing direction occupy a low areal percentage. Such low areal percentage is associated with the fact that the aforementioned aggregate structure is more likely to lose the directional property thereof when heated and with recrystallization facilitated thereupon. Particularly, the aforementioned areal percentage can be controlled based on the heating temperature, such percentage reaching 100% when the temperature inside the furnace is 210 to 260° C., and about 50% when the temperature inside the furnace is 660 to 700° C.

According to the manufacturing method of the bonding wire of the present invention, a special method is required to manufacture the bonding wire having the coating layer whose surface is as hard as 0.2 to 2.0 GPa in terms of the Meyer hardness, which would otherwise be difficult if employing the normal method. Namely, such special method allows the alloy of palladium and gold on the surface of the bonding wire to be formed particularly soft and then the bonding wire to be manufactured. Specifically, the corresponding bonding wire can be manufactured by: performing drawing until the diameter thereof has reached a desired length through any one of the aforementioned methods; heating the bonding wire thus drawn so as to facilitate alloying; and placing each spool of the bonding wire thus heated in the electric furnace under the atmosphere of argon with 4% of hydrogen mixed therein, so as to further heat the bonding wire at a temperature of 130 to 180° C., for 24 to 28 hours. The alloy of palladium and gold cannot be formed particularly soft as described above if the heating is carried out at a temperature lower than 130° C. or for a time period shorter than 24 hours. However, if the heating is carried out at a temperature higher than 180° C. or for a time period longer than 28 hours, diffusions among neighboring bonding wires are facilitated, thus possibly causing the corresponding bonding wires to stick to one another.

EXAMPLES

Examples of the present invention are described hereunder.

In the beginning, there are described manufacturing examples and evaluations of a bonding wire having an alloy layer formed on a surface of the aforementioned coating layer, such alloy layer containing silver and palladium.

As raw materials of a bonding wire, there were respectively prepared: copper for use in a core wire; B, P, Se, Ca and Al each serving as an additive element in the core wire; palladium for use in a coating layer; and silver for use in a skin layer and having a purity of 99.99% by mass or higher. The aforementioned copper or a mixture of such copper and the additive element was then weighed as a starting material, followed by heating and melting such starting material under high vacuum so as to obtain an ingot of copper or a copper alloy of about 10 mm long in diameter. Next, there was manufactured a wire of a given diameter through forging, rolling and drawing. Subsequently, there was formed on a surface of such wire the coating layer containing palladium, through electrolytic plating. Here, a thickness of this coating layer was determined by a time spent in electrolytic plating. A silver film was further formed on a surface of the coating layer through electrolytic plating, followed by continuously dragging the wire thus obtained through a furnace maintained at 300 to 800° C., at a speed of 60 m/min, thus forming an alloy layer of silver and palladium on the surface of the coating layer. Here, a thickness of this alloy layer is determined by amount of the silver film, namely, a time spent in electrolytic plating for forming the silver film. In this way, there was obtained a bonding wire having a diameter of 20 μm. As for certain samples in certain examples, those having wire diameters of 80 μm or longer were drawn at reduction rates of 13 to 18% in areas of the dies, and those whose wire diameters were less than 80 μm were drawn at reduction rates of 8 to 12% in areas of the dies. In this way, there were controlled an area of crystal grains whose <100> crystal orientations were angled at 15 degrees or less with respect to a wire drawing direction, by performing drawing with area reduction rates higher than usual. Further, in certain examples, a spool of the bonding wire was placed in an electric furnace under an argon atmosphere, and was heated at a temperature of 150 to 200° C. for 20 to 24 hours, thus controlling a Meyer hardness of the surface of the coating layer.

As for the bonding wire thus obtained, the diameter of the core wire and the thicknesses of the coating layer and the alloy layer were then measured by: performing AES analysis while sputtering a surface of the bonding wire; and grinding a cross-sectional surface of the bonding wire so as to analyze a composition of the corresponding cross-sectional surface through EDX. A region with a palladium concentration of 50% or higher and a silver concentration of less than 10%, was regarded as the coating layer. Further, a region with a silver concentration of 10 to 70% was regarded as the alloy layer formed on the surface of the coating layer and containing silver and palladium. Tables 1 through 5 show the thicknesses and compositions of the coating layer and the alloy layer.

In order to evaluate an oxidation resistivity of the bonding wire effected by the coating layer, a spool of the bonding wire was also placed in a high-temperature/humidity furnace at a temperature of 85° C. and a humidity of 85% for 72 hours so as to intentionally and experimentally accelerate oxidation on the surface of the bonding wire. The bonding wire thus heated was then removed from the high-temperature/humidity furnace, and an optical microscope was further used to observe a degree of oxidation on the surface of the corresponding bonding wire. Here, a column titled "long-term storage (oxidation)" in Table 1 and Table 5 contains crosses, triangles and circles. Specifically, the crosses indicate that the entire surface of the bonding wire is oxidized, the triangles indicate that the surface of the bonding wire is partially oxidized, and the circles indicate that the surface of the bonding wire is not oxidized.

In order to evaluate a sulfuration resistivity of the bonding wire effected by the coating layer, a spool of the bonding wire was also placed in a high-temperature furnace maintained at a temperature of 195° C. in air, for 155 hours, so as to intentionally and experimentally accelerate sulfuration on the surface of the bonding wire. When placed in air at a high temperature, sulfuration on the surface of the bonding wire can be accelerated even with a minute amount of sulfur contained in the atmosphere. The bonding wire thus heated was then removed from the high-temperature furnace, and a colorimeter (Minolta CR-300) was further used to observe a degree of sulfuration on the surface of the corresponding bonding wire. Particularly, a luminosity (L*) equal to or below 30 indicated that the surface of the bonding wire had been sulfurated. Further, a luminosity higher than 30 but not higher than 40 indicated that the bonding wire was satisfactory in terms of practical use. Furthermore, a luminosity higher than 40 was regarded as a favorable level. Here, a column titled "long-term storage (sulfuration)" in Table 1 and Table 5 contains crosses, triangles and circles. Specifically, the crosses indicate that sulfurated portions are observed on the surface of the bonding wire, the triangles indicate that the bonding wire is satisfactory in terms of practical use, and the circles indicate that the surface of the bonding wire is not sulfurated.

A commercially available automatic wire bonder was then used to bond the bonding wire. Specifically, a ball was formed on a front end of the bonding wire through arc discharge, immediately before bonding the bonding wire, such ball having a diameter of 34 μm which was 1.7 times longer than the diameter of the bonding wire. Here, the corresponding ball was formed under a nitrogen atmosphere.

An actual diameter of the ball was obtained by measuring diameters of 20 balls, using SEM. Here, a column titled "FAB sphericity in nitrogen" in Table 1 and Table 5 contains crosses, triangles, circles and double circles. Specifically, the crosses represent measurement results in which a difference between a maximum diameter and a minimum diameter is greater than 10% of an average value of the ball diameters. For this reason, the crosses indicate considerable variations and poor conditions. Further, the triangles represent intermediate conditions in which the corresponding difference is greater than 5% of the average value of the ball diameters but not more than 10%. Furthermore, the circles represent conditions that are favorable in terms of practical use, in which the corresponding difference is greater than 3% of the average value of the ball diameters but not more than 5%. Furthermore, the double circles represent significantly favorable conditions in which the corresponding difference is not more than 3% of the average value of the ball diameters.

The ball was further analyzed using SEM so as to observe bubbles formed thereon. Results thereof are found in a column titled "FAB bubble control in nitrogen" in Table 1 and Table 5. In addition, cross-sectional surfaces of 10 balls were grinded and further observed using the optical microscope. According to the column titled "FAB bubble control in nitrogen" in Table 1 and Table 5, pairs of double circles represent significantly favorable conditions in which no bubble is observed on the corresponding cross-sectional surfaces. Further, double circles represent favorable conditions in which the bubbles are observed in only one to two balls out of ten. Furthermore, circles represent conditions favorable in terms of practical use, in which the bubbles are observed in only three to four balls out of ten. Furthermore, triangles represent conditions acceptable in terms of practical use, in which the bubbles are observed in five balls out of ten. Furthermore, crosses represent poor conditions in which the bubbles are observed in as many as or more than six balls out of ten.

The bonding wire was then respectively bonded to an Al electrode of 1 μm formed on a Si chip, and a lead of lead frame plated with silver or palladium. The aforementioned ball was further ball-bonded to the corresponding electrode heated at 260° C., followed by wedge-bonding a base part of the bonding wire to the lead heated at 260° C. and forming another ball thereafter, thus performing bonding in a continuous manner. Here, a loop length was set to be 4.9 mm. Particularly, there were respectively performed: a reverse bonding in which the loop length was about 1 mm; a high loop bonding in which a loop height was about 304.8 μm (12 mil) and the loop length was about 2 mm; a low loop bonding in which the loop length was about 3 mm and the loop height was 76.2 μm (3 mil); and a long bonding in which the loop length was 5.3 mm (210 mil).

As far as a wedge bondability of the bonding wire is concerned, breaking loads (peel strengths) of 40 wedge-bonded bonding wires were measured through the so-called peel strength measurement. Specifically, each wedge-bonded bonding wire was pulled upward immediately above a wedge-bonded portion before being cut, and the breaking load was measured at the time of cutting the corresponding bonding wire. A column titled "Ag-L/F 2nd bonding" (lead of a silver-plated lead frame) and a column titled "Pd-L/F 2nd bonding" (lead of a palladium-plated lead frame) in Table 1 and Table 5, respectively contain crosses, triangles and circles. Specifically, the crosses indicate that a standard deviation of the peel strength is greater than 6 mN, and that considerable variations exist and need to be fixed.

Further, the triangles represent conditions acceptable in terms of practical use, in which the corresponding standard deviation is greater than 5 mN but not greater than 6 mN. Furthermore, the circles indicate that the corresponding standard deviation is equal to or less than 5 mN, and that there should not be any significant problems in terms of practical use.

Here, the optical microscope was used to observe whether or not flaws had been formed on a loop by a capillary. Particularly, 20 loops were observed. A column titled "flaw control" in Table 1 and Table 5 contains pairs of double circles, double circles, circles, triangles and crosses. Specifically, the pairs of double circles represent significantly favorable conditions in which none of the loops is found with flaws. Further, the double circles represent favorable conditions in which only one to two loops are found with flaws. Furthermore, the circles represent conditions problem-free in terms of practical use, in which only three to four loops are found with flaws. Furthermore, the triangles represent conditions acceptable in terms of practical use, in which five loops are found with flaws. Furthermore, the crosses represent poor conditions in which as many as or more than six loops are found with flaws.

An EBSD method was used to observe individual crystal orientations of the crystal grains found on the surface of the aforementioned coating layer, thus calculating angles at which the <100> crystal orientations of the crystal grains are angled with respect to the wire drawing direction. In order to calculate aforementioned angles, three different surface areas having an 8 μm width perpendicular to the drawn direction of the bonding wire and a 150 μm in the drawn direction were observed in each working sample. The values thus obtained are found in a column titled "area of crystal grains with <100> crystal orientations angled at 15 degrees or less with respect to wire drawing direction" in Tables 2 through 4.

The EBSD method was also used to observe individual crystal orientations of the crystal grains found on the surface of the aforementioned coating layer, thus calculating angles at which the <111> crystal orientations of the crystal grains are angled with respect to the wire drawing direction. In order to calculate aforementioned angles, three different surface areas having an 8 μm width perpendicular to the drawn direction of the bonding wire and a 150 μm in the drawn direction were observed in each working sample. The values thus obtained are found in a column titled "area of crystal grains with <111> crystal orientations angled at 15 degrees or less with respect to wire drawing direction" in Tables 2 through 4.

In each example, the optical microscope was also used to observe crinkles on surfaces of 20 loops of the bonding wire bonded through the reverse bonding. Here, a column titled "reverse bonding crinkle control" in Tables 2 through 4 contains pairs of double circles, double circles, circles and crosses. Specifically, the pairs of double circles represent significantly favorable conditions in which none of the loops is found with the crinkles. Further, the double circles represent favorable conditions in which only one to two loops are found with the crinkles. Furthermore, the circles represent conditions problem-free in terms of practical use, in which only three to four loops are found with crinkles. Furthermore, the crosses represent poor conditions in which as many as or more than five loops are found with crinkles.

In each example, the optical microscope was also used to observe leaning failures of the bonding wire bonded through the high loop bonding. Specifically, 20 loops of the corresponding bonding wire were observed using the optical microscope. Here, a column titled "high loop leaning control" in Table 2 contains pairs of double circles, double circles, circles and crosses. Specifically, the pairs of double circles represent significantly favorable conditions in which none of the loops is found with the leaning failures. Further, the double circles represent favorable conditions in which only one to two loops are found with the leaning failures. Furthermore, the circles represent conditions problem-free in terms of practical use, in which only three to four loops are found with leaning failures. Furthermore, the crosses represent poor conditions in which as many as or more than five loops are found with leaning failures.

The Mayer hardness of the surface of the bonding wire was measured through a nanoindentation method to a precision of within about 1 nm in depth. The measurement values thus obtained are found in a column titled "Meyer hardness of wire surface" in Table 3 and Table 4.

In each example, the optical microscope was also used to observe presence of damages on a neck section of the bonding wire bonded through the low loop bonding. Particularly, 20 loops of the corresponding bonding wire were observed using the optical microscope. Here, a column titled "76.2 μm (3 mil)-low loop neck damage" in Table 3 and Table 4 contains double circles, circles and crosses. Specifically, the double circles represent favorable conditions in which none of the loops was found with the damages. Further, the circles represent problem-free conditions in which only one to two loops out of the 20 loops are found with the damages. Furthermore, the crosses represent poor conditions in which as many as or more than three loops out of the 20 loops are found with the damages.

In each example, a projector was used to measure bending of the loop of the bonding wire bonded through the long bonding. Particularly, bending of 20 loops of the corresponding bonding wire was measured. Here, a wire bending ratio was calculated by dividing an average value of the bending measured by the corresponding loop length. A column titled "5.3 mm (210 mil)-long bending" in Table 4 contains double circles, circles and crosses. Specifically, the double circles represent significantly favorable conditions in which the wire bending ratio is less than 4%. Further, the circles represent conditions problem-free in terms of practical use, in which the wire bending ratio is 4 to 5%. Furthermore, the crosses represent poor conditions in which the wire bending ratio is greater than 5%.

Next, there are described manufacturing examples and evaluations of a bonding wire having an alloy layer formed on a surface of the aforementioned coating layer, such alloy layer containing gold and palladium.

As raw materials of this bonding wire, there were respectively prepared: copper for use in a core wire; B, P, Se, Ca and Al each serving as an additive element in the core wire; palladium for use in a coating layer; and gold for use in a skin layer and having a purity of 99.99% by mass or higher. The aforementioned copper or a mixture of such copper and the additive element was then weighed as a starting material, followed by heating and melting such starting material under high vacuum so as to obtain an ingot of copper or a copper alloy of about 10 mm long in diameter. Next, there was manufactured a wire of a given diameter through forging, rolling and drawing. Subsequently, there was formed on a surface of such wire the coating layer containing palladium, through electrolytic plating. Here, a thickness of this coating layer was determined by a time spent in electrolytic plating. A gold film was further formed on a surface of the coating layer through electrolytic plating, followed by continuously dragging the wire thus obtained through a furnace maintained at 300 to 800° C., at a speed of 30 m/min, thus forming an alloy layer of gold and palladium on the surface of the coating layer. Here, a thickness of this alloy layer is determined by amount of the gold film, namely, a time spent in electrolytic plating for forming the gold film. In this way, there was obtained a bonding wire whose core wire has a diameter of 20 μm. As for certain samples in certain examples, those having wire diameters of 150 μm or longer were drawn at reduction rates of 16 to 20% in areas of the dies, and those whose wire diameters were less than 150 μm were drawn at reduction rates of 13 to 15% in areas of the dies. In this way, there were controlled an area of crystal grains whose <111> crystal orientations were angled at 15 degrees or less with respect to a wire drawing direction, by performing drawing with area reduction rates higher than usual. Further, in certain examples, a spool of the bonding wire was placed in an electric furnace under an argon atmosphere, and was heated at a temperature of 150 to 200° C. for 20 to 24 hours, thus controlling the Meyer hardness of the surface of the coating layer.

As for the bonding wire thus obtained, the diameter of the core wire and the thicknesses of the coating layer and the alloy layer were then measured by: performing AES analysis while sputtering a surface of the bonding wire; and grinding a cross-sectional surface of the bonding wire so as to analyze a composition of the corresponding cross-sectional surface through EDX. A region with a palladium concentration of 50% or higher and a gold concentration of less than 15%, was regarded as the coating layer. Further, a region with a gold concentration of 15 to 75% was regarded as the alloy layer formed on the surface of the coating layer and containing gold and palladium. Tables 6 through 10 show the thicknesses and compositions of the coating layer and the alloy layer.

In order to evaluate an oxidation resistivity of the bonding wire effected by the coating layer, a spool of the bonding wire along with the spool was also placed in a high-temperature/humidity furnace of a temperature of 85° C. and a humidity of 85% for 72 hours so as to intentionally and experimentally accelerate oxidation on the surface of the bonding wire. The bonding wire thus heated was then removed from the high-temperature/humidity furnace, and an optical microscope was further used to observe a degree of oxidation on the surface of the corresponding bonding wire. Here, a column titled "long-term storage (oxidation)" in Table 6 and Table 10 contains crosses, and circles. Specifically, the crosses indicate that the entire surface of the bonding wire is oxidized, and the circles indicate that the surface of the bonding wire is not oxidized.

In order to evaluate a sulfuration resistivity of the bonding wire effected by the coating layer, a spool of the bonding wire was also placed in a high-temperature furnace maintained at a temperature of 195° C. in air, for 155 hours, so as to intentionally and experimentally accelerate sulfuration on the surface of the bonding wire. When placed in air at a high temperature, sulfuration on the surface of the bonding wire can be accelerated even with a minute amount of sulfur contained in the atmosphere. The bonding wire thus heated was then removed from the high-temperature furnace, and a colorimeter (Minolta CR-300) was further used to observe a degree of sulfuration on the surface of the corresponding bonding wire. Particularly, a luminosity (L*) equal to or below 30 indicated that the surface of the bonding wire had been sulfurated. Further, a luminosity higher than 30 but not higher than 40 indicated that the bonding wire was satisfactory in terms of practical use. Furthermore, a luminosity higher than 40 was regarded as a favorable level. Here, a column titled "long-term storage (sulfuration)" in Table 6 and Table 10 contains crosses, triangles and circles. Specifically, the crosses indicate that sulfurated portions are observed on the surface of the bonding wire, the triangles indicate that the bonding wire is satisfactory in terms of practical use, and the circles indicate that the surface of the bonding wire is not sulfurated.

A commercially available automatic wire bonder was then used to bond the bonding wire. Specifically, a ball was formed on a front end of the bonding wire through arc discharge, immediately before bonding the bonding wire, such ball having a diameter of 34 μm which was 1.7 times longer than the diameter of the bonding wire. Here, the corresponding ball was formed under a nitrogen atmosphere.

An actual diameter of the ball was obtained by measuring diameters of 20 balls, using SEM. Here, a column titled "FAB sphericity in nitrogen" in Table 6 and Table 10 contains crosses, triangles, circles and double circles. Specifically, the crosses represent measurement results in which a difference between a maximum diameter and a minimum diameter is greater than 10% of an average value of the ball diameters. For this reason, the crosses indicate considerable variations and poor conditions. Further, the triangles represent intermediate conditions in which the corresponding difference is greater than 5% of the average value of the ball diameters but not more than 10%. Furthermore, the circles represent conditions that are favorable in terms of practical use, in which the corresponding difference is greater than 3% of the average value of the ball diameters but not more than 5%. Furthermore, the double circles represent significantly favorable conditions in which the corresponding difference is not more than 3% of the average value of the ball diameters.

The ball was further analyzed using SEM so as to observe bubbles formed thereon. Here, a column titled "FAB bubble control in nitrogen" in Table 6 and Table 10 contains crosses and circles. Specifically, the crosses represent conditions in which the bubbles are observed on the ball, and the circles represent conditions in which no bubble is observed on the ball.

The bonding wire was then respectively bonded to an Al electrode of 1 μm formed on a Si chip, and a lead of lead frame plated with gold or palladium. The aforementioned ball was further ball-bonded to the corresponding electrode heated at 260° C., followed by wedge-bonding a base part of the bonding wire to the lead heated at 260° C. and forming another ball thereafter, thus performing bonding in a continuous manner. Here, a loop length was set to be 4.9 mm. Particularly, there were respectively performed: a high loop bonding in which a loop height was about 304.8 μm (12 mil) and the loop length was about 2 mm; a low loop bonding in which the loop length was about 3 mm and the loop height was 76.2 μm (3 mil); and a long bonding in which the loop length was 5.3 mm (210 mil).

As far as a wedge bondability of the bonding wire is concerned, breaking loads (peel strengths) of 40 wedge-bonded bonding wires were measured through the so-called peel strength measurement. Specifically, each wedge-bonded bonding wire was pulled upward immediately above a wedge-bonded portion before being cut, and the breaking load was measured at the time of cutting the corresponding bonding wire. A column titled "Ag-L/F 2nd bonding" (lead of a gold-plated lead frame) and a column titled "Pd-L/F 2nd bonding" (lead of a palladium-plated lead frame) in Table 6 and Table 10, respectively contain crosses, circles and double circles. Specifically, the crosses indicate that a standard deviation of the peel strength is greater than 5 mN, and that considerable variations exist and need to be fixed. Further, the circles indicate that the corresponding standard deviation is greater than 3 mN but not greater than 5 mN, and that there should not be any significant problems in terms of practical use. Furthermore, the double circles represent favorable conditions in which the corresponding standard deviation is equal to or less than 3 mN, and the variations are thus significantly small.

Here, the optical microscope was used to observe whether or not flaws had been formed on a loop by a capillary. Particularly, 20 loops were observed. A column titled "flaw control" in Table 6 and Table 10 contains pairs of double circles, double circles, circles, triangles and crosses. Specifically, the pairs of double circles represent significantly favorable conditions in which none of the loops is found with flaws. Further, the double circles represent favorable conditions in which only one to two loops are found with flaws. Furthermore, the circles represent conditions problem-free in terms of practical use, in which only three to four loops are found with flaws. Furthermore, the triangles represent conditions acceptable in terms of practical use, in which five loops are found with flaws. Furthermore, the crosses represent poor conditions in which as many as or more than six loops are found with flaws.

An EBSD method was used to observe individual crystal orientations of the crystal grains found on the surface of the aforementioned coating layer, thus calculating angles at which the <111> crystal orientations of the crystal grains are angled with respect to the wire drawing direction. In order to calculate aforementioned angles, three different surface areas having an 8 μm width perpendicular to the drawn direction of the bonding wire and a 150 μm in the drawn direction were observed in each working sample. The values thus obtained are found in a column titled "area of crystal grains with <111> crystal orientations angled at 15 degrees or less with respect to wire drawing direction" in Tables 7 through 9.

In each example, the optical microscope was also used to observe leaning failures of the bonding wire bonded through the high loop bonding. Specifically, 20 loops of the corresponding bonding wire were observed using the optical microscope. Here, a column titled "high loop leaning control" in Tables 7 through 9 contains pairs of double circles, double circles, circles and crosses. Specifically, the pairs of double circles represent significantly favorable conditions in which none of the loops is found with the leaning failures. Further, the double circles represent favorable conditions in which only one to two loops are found with the leaning failures. Furthermore, the circles represent conditions problem-free in terms of practical use, in which only three to four loops are found with leaning failures. Furthermore, the crosses represent poor conditions in which as many as or more than five loops are found with leaning failures.

The Mayer hardness of the surface of the bonding wire was measured through a nanoindentation method to a precision of within about 1 nm in depth. The measurement values thus obtained are found in a column titled "Meyer hardness of wire surface" in Table 8 and Table 9.

In each example, the optical microscope was also used to observe presence of damages on a neck section of the bonding wire bonded through the low loop bonding. Particularly, 20 loops of the corresponding bonding wire were observed using the optical microscope. Here, a column titled "76.2 μm (3 mil)-low loop neck damage" in Table 8 and Table 9 contains double circles, circles and crosses. Specifically, the double circles represent favorable conditions in which none of the loops was found with the damages. Further, the circles represent problem-free conditions in which only one to two loops out of the 20 loops are found with the damages. Furthermore, the crosses represent poor conditions in which as many as or more than three loops out of the 20 loops are found with the damages.

In each example, a projector was used to measure bending of the loop of the bonding wire bonded through the long bonding. Particularly, bending of 20 loops of the corresponding bonding wire was measured. Here, a wire bending ratio was calculated by dividing an average value of the bending measured by the corresponding loop length. A column titled "5.3 mm (210 mil)-long bending" in Table 8 contains double circles, circles, triangles and crosses. Specifically, the double circles represent significantly favorable conditions in which the wire bending ratio is less than 4%. Further, the circles represent conditions problem-free in terms of practical use, in which the wire bending ratio is 4 to 5%. Furthermore, the triangles represent conditions acceptable in terms of practical use, in which the wire bending ratio is 5 to 6%. Furthermore, the crosses represent poor conditions in which the wire bending ratio is greater than 6%.

As for an evaluation concerning chip damage, cross-sectional surfaces of 20 ball-bonded portions were grinded. Here, a column titled "chip damage" in Table 8 contains crosses and circles. Specifically, the crosses represent poor conditions in which the electrode is found with cracks. Further, the circles represent favorable conditions in which no crack is found on the electrode.

Evaluation results in Tables 1 through 10 are described hereunder.

According to examples 1 through 63 in Table 1 and examples 136 through 192 in Table 6, there was manufactured the bonding wire having 10 to 200 nm thick palladium coating layer formed on the surface of the copper core wire, and 1 to 80 nm alloy layer further formed on the corresponding coating layer, such alloy layer being composed of either silver and palladium or gold and palladium. According to this bonding wire, there can be achieved a favorable wedge bondability with respect to the palladium-plated lead frame (column titled "Pd-L/F 2nd bonding"), while ensuring the oxidation resistivity (column titled "long-term storage (oxidation)") and the sphericity of the ball (column titled "FAB sphericity in nitrogen"). In contrast, as shown in a comparative example 1, a poor long-term storageability and poor 2nd bondability were achieved with a bonding wire composed of only the copper core wire with no coating layer formed thereon. Further, as shown in a comparative example 2, a poor sphericity of the ball in nitrogen was achieved with a bonding wire having the copper core wire and a silver coating layer formed thereon. Furthermore, as shown in comparative examples 3 through 5, a poor wedge bondability with respect to the palladium-plated lead frame was achieved with a bonding wire having the copper core wire and only the palladium coating layer formed thereon. Furthermore, as shown in a comparative example 6, there was also achieved a poor wedge bondability with respect to the palladium-plated lead frame, when the thickness of the alloy layer of silver and palladium formed on the coating layer was less than 3 nm, even though, the thickness of the palladium coating layer formed on the copper core wire was 10 to 20 nm. Furthermore, as shown in a comparative example 7, there can hardly be ensured a stable quality of the bonding wire, when the thickness of the alloy layer of silver and palladium formed on the coating layer was greater than 80 nm, even though, the thickness of the palladium coating layer formed on the copper core wire was 10 to 200 nm. The alloy layer in the comparative example 7 is susceptible to sulfuration and oxidation, thus resulting in a poor evaluation in any one of the corresponding properties evaluated. Furthermore, as shown in a comparative example 8, there was also achieved a poor wedge bondability with respect to the palladium-plated lead frame, when there was formed on the copper core wire the palladium coating layer of 10 to 200 nm and the silver concentration in the alloy layer of silver and palladium formed on the corresponding coating layer was less than 10%. Furthermore, as shown in a comparative example 9, there was also achieved a poor sphericity of the ball in nitrogen, when there was formed on the copper core wire the palladium coating layer of 10 to 200 nm and the silver concentration in the alloy layer of silver and palladium formed on the corresponding coating layer was greater than 75%. Furthermore, as shown in a comparative example 10, when the thickness of the palladium coating layer formed on the copper core wire was beyond the range of 10 to 200 nm, the bubbles were observed in a small-diameter ball formed in nitrogen (column titled "FAB bubble control in nitrogen") even if the thickness of the alloy layer of silver and palladium formed on the corresponding coating layer was 3 to 80 nm. Furthermore, as shown in a comparative example 11, a poor long-term storageability and poor 2nd bondability were achieved with a bonding wire composed of only the copper core wire with no coating layer formed thereon. Furthermore, as shown in a comparative example 12, a bonding wire having the silver coating layer formed on the copper core wire exhibited a significantly poor sphericity of the ball in nitrogen, and was sulfurated during a period of long-term storage. Furthermore, as shown in a comparative example 13, a bonding wire having a gold coating layer formed on the copper core wire also exhibited a significantly poor sphericity of the ball in nitrogen. Furthermore, as shown in comparative examples 14 through 16, a poor wedge bondability with respect to the palladium-plated lead frame was achieved with a bonding wire composed of the copper core wire and only the palladium coating layer formed thereon. Furthermore, as shown in a comparative example 17, there was achieved an insufficient wedge bondability with respect to the palladium-plated lead frame, when the thickness of the alloy layer of gold and palladium formed on the palladium coating layer was less than 3 nm, even though, the thickness of the corresponding coating layer formed on the copper core wire was 10 to 200 nm. Furthermore, as shown in a comparative example 18, there was manufactured a bonding wire having 10 to 200 nm thick palladium coating layer formed on the copper core wire, and the alloy layer of gold and palladium of a thickness greater 80 nm formed on the corresponding coating layer. According to this bonding wire, a stable quality thereof was hardly ensured. In fact, there was achieved a poor wedge bondability with respect to the palladium-plated lead frame (column titled "Pd-L/F 2nd bonding") with this bonding wire. In addition, the corresponding alloy layer of this bonding wire was oxidized, thus resulting in an unsatisfactory sphericity of the ball (column titled "FAB sphericity in nitrogen"). Furthermore, as shown in a comparative example 19, there was also achieved an insufficient wedge bondability with respect to the palladium-plated lead frame, when the gold concentration in the alloy layer of gold and palladium formed on the palladium coating layer was less than 15%, even though, the thickness of the corresponding coating layer formed on the copper core wire was 10 to 200 nm. Furthermore, as shown in a comparative example 10, there was achieved a poor sphericity of the ball in nitrogen, when the 20 to 200 nm thick palladium coating layer of was formed on the copper core wire and the gold concentration in the alloy layer of gold and palladium formed on the corresponding coating layer was greater than 75%. Furthermore, as shown in a comparative example 21, when the thickness of the palladium coating layer formed on the copper core wire was beyond the range of 10 to 200 nm, the bubbles were observed in a small-diameter ball formed in nitrogen ("FAB bubble control in nitrogen") even if the thickness of the alloy layer of gold and palladium formed on the corresponding coating layer was 3 to 80 nm.

Next, there are described examples of the bonding wire having the alloy layer of silver and palladium formed on the coating layer.

According to the examples 1 through 12, 16 through 27, 31 through 42 and 46 through 57 in Table 1, there was manufactured the bonding wire having 10 to 200 nm thick palladium coating layer formed on the surface of the copper core wire, and 1 to 30 nm thick alloy layer further formed on the corresponding coating layer, such alloy layer being composed of silver and palladium. According to this bonding wire, there can be achieved a favorable wedge bondability with respect to the palladium-plated lead frame (column titled "Pd-L/F 2nd bonding"), while ensuring the oxidation resistivity (column titled "long-term storage (oxidation)") and the sphericity of the ball (column titled "FAB sphericity in nitrogen"). In contrast, as shown in the comparative example 1, a poor long-term storageability and poor 2nd bondability were achieved with the bonding wire composed of only the copper core wire with no coating layer formed thereon. Further, as shown in the comparative example 2, a poor sphericity of the ball in nitrogen was achieved with the bonding wire having the copper core wire and the silver coating layer formed thereon. Furthermore, as shown in comparative examples 3 through 5, a poor wedge bondability with respect to the palladium-plated lead frame was achieved with the bonding wire having the copper core wire and only the palladium coating layer formed thereon. Furthermore, as shown in the comparative example 6, there was also achieved a poor wedge bondability with respect to the palladium-plated lead frame, when the thickness of the alloy layer of silver and palladium formed on the coating layer was less than 1 nm, even though, the thickness of the palladium coating layer formed on the copper core wire was 10 to 200 nm. Furthermore, as shown in the comparative example 7, there can hardly be ensured a stable quality of the bonding wire, when the thickness of the alloy layer of silver and palladium formed on the coating layer was greater than 30 nm, even though, the thickness of the palladium coating layer formed on the copper core wire was 10 to 200 nm. The alloy layer in the comparative example 7 is susceptible to sulfuration and oxidation, thus resulting in a poor evaluation in any one of the corresponding properties evaluated. Furthermore, as shown in the comparative example 8, there was also achieved a poor wedge bondability with respect to the palladium-plated lead frame, when there was formed on the copper core wire the palladium coating layer of 10 to 200 nm and the silver concentration in the alloy layer of silver and palladium formed on the corresponding coating layer was less than 10%. Furthermore, as shown in the comparative example 9, there was also achieved a poor sphericity of the ball in nitrogen, when there was formed on the copper core wire the 10 to 200 nm thick palladium coating layer and the silver concentration in the alloy layer of silver and palladium formed on the corresponding coating layer was greater than 70%. Furthermore, as shown in the comparative example 10, when the thickness of the palladium coating layer formed on the copper core wire was beyond the range of 10 to 200 nm, the bubbles were observed in the small-diameter ball formed in nitrogen (column titled "FAB bubble control in nitrogen") even if the thickness of the alloy layer of silver and palladium formed on the corresponding coating layer was 3 to 30 nm.

As shown in the examples 16 through 63, when the silver concentration in the alloy of silver and palladium was equal to or higher than 20%, not only flaws formed by the capillary could be further effectively controlled (column titled "flaw control"), but also the bubbles on the small-diameter ball formed in nitrogen could be controlled (column titled "FAB bubble control in nitrogen"). Further, as shown in the examples 31 through 63, it was found that the flaws and the bubbles could be even more effectively controlled, when the corresponding silver concentration was equal to or higher than 30%.

As shown in examples 64 through 91 in Table 2, the crinkles on the loops of the bonding wire bonded through the reverse bonding could be further effectively controlled (column titled "reverse bonding crinkle control"), when the crystal grains with the <100> crystal orientations angled at 15 degrees or less with respect to the wire drawing direction occupy an areal percentage of 50 to 100%, such crystal grains being observed on the surface of the bonding wire. Particularly, such crinkles could be even more effectively controlled when the area of the corresponding crystal grains was present by as much as or greater than 70%.

As shown in examples 4 through 6 in Table 2, the leaning failures of the bonding wire bonded through the high loop bonding could be further effectively controlled (column titled "high loop leaning control"), when the crystal grains with the <111> crystal orientations angled at 15 degrees or less with respect to the wire drawing direction occupy an areal percentage of 60 to 100%, such crystal grains being observed on the surface of the bonding wire. Particularly, such leaning failures could be even more effectively controlled, when the aforementioned areal percentage is not less than 70%.

As shown in examples 92 through 96, 99 through 102 and 104 in Table 3, when the Meyer hardness of the surface of the bonding wire was 0.2 to 2.0 GPa, the aforementioned neck damage could be controlled even after performing the low loop bonding (column titled "76.2 μm (3 mil)-low loop neck damage").

As shown in examples 109 through 117, and 121 through 124 in Table 4, when the core wire was actually made of the copper alloy containing at least one of B, P and Se by a total amount of 5 to 300 ppm by mass, bending of the loops could be controlled even after performing the long bonding (column titled "5.3 mm (210 mil)-long bending").

As shown in examples 125 through 135 in Table 5, it was found that the aforementioned effects of the present invention could be achieved even when there was formed a diffusion layer between the coating layer and the core wire and copper contained in the core wire was diffused into the coating layer.

Next, there are described examples of the bonding wire having the alloy layer of gold and palladium formed on the coating layer.

According to examples 136 through 192 in Table 6, there was manufactured the bonding wire having 10 to 200 nm thick palladium coating layer formed on the surface of the copper core wire, and 1 to 80 nm thick alloy layer of further formed on the corresponding coating layer, such alloy layer being composed of gold and palladium. According to this bonding wire, there can be achieved a favorable wedge bondability with respect to the palladium-plated lead frame (column titled "Pd-L/F 2nd bonding"), while ensuring the oxidation resistivity (column titled "long-term storage (oxidation)"), the sulfuration resistivity (column titled "long-term storage (sulfuration)") and the sphericity of the ball (column titled "FAB sphericity in nitrogen"). In contrast, as shown in the comparative example 1, a poor long-term storageability and poor 2nd bondability were achieved with the bonding wire composed of only the copper core wire with no coating layer formed thereon. Further, as shown in the comparative example 11, a poor sphericity of the ball in nitrogen was achieved with the bonding wire having the copper core wire and the gold coating layer formed thereon. Furthermore, as shown in the comparative example 12, there was also achieved an insufficient wedge bondability with respect to the palladium-plated lead frame, when the thickness of the alloy layer of gold and palladium formed on the coating layer was less than 1 nm, even though, the thickness of the palladium coating layer formed on the copper core wire was 10 to 20 nm. Furthermore, as shown in the comparative example 13, there can hardly be ensured a stable quality of the bonding wire, when the thickness of the alloy layer of gold and palladium formed on the coating layer was greater than 80 nm, even though, the thickness of the palladium coating layer formed on the copper core wire was 10 to 200 nm. Particularly, there was achieved a poor wedge bondability with respect to the palladium-plated lead frame (column titled "Pd-L/F 2nd bonding"), with a bonding wire in the comparative example 13. In this case, there was also achieved an unsatisfactory sphericity of the ball due to oxidation of the corresponding alloy layer (column titled "FAB sphericity in nitrogen"). Furthermore, as shown in the comparative example 14, there was achieved an insufficient wedge bondability with respect to the palladium-plated lead frame, when there was formed on the copper core wire the 10 to 200 nm thick palladium coating layer and the gold concentration in the alloy layer of gold and palladium formed on the corresponding coating layer was less than 15%. Furthermore, as shown in the comparative example 15, there was also achieved a poor sphericity of the ball in nitrogen, when there was formed on the copper core wire the 20 to 200 nm thick palladium coating layer and the gold concentration in the alloy layer of gold and palladium formed on the corresponding coating layer was greater than 75%. Furthermore, as shown in the comparative example 16, when the thickness of the palladium coating layer formed on the copper core wire was beyond the range of 10 to 200 nm, the bubbles were observed in the small-diameter ball formed in nitrogen (column titled "FAB bubble control in nitrogen") even if the thickness of the alloy layer of gold and palladium formed on the corresponding coating layer was 3 to 80 nm.

As shown in the examples 136 through 168, examples 250, 251, 253 and 256, the sphericity of the ball further improved when the gold concentration in the alloy of gold and palladium was not less than 15% but less than 40% (column titled "FAB sphericity in nitrogen").

As shown in the examples 169 through 192, examples 252, 254 and 255, and examples 257 through 260, the wedge bondability further improved when the gold concentration in the alloy of gold and palladium was as much as or more than 40% (column titled "Pd-L/F 2nd bonding").

As shown in examples 193 through 216 in Table 7, the leaning failures of the bonding wire bonded through the high loop bonding could be further effectively controlled (column titled "high loop leaning control"), when the crystal grains with the <111> crystal orientations angled at 15 degrees or less with respect to the wire drawing direction occupy an areal percentage of 50 to 100%, such crystal grains being observed on the surface of the bonding wire. Particularly, such leaning failures could be even more effectively controlled, when the aforementioned areal percentage is not less than 70%.

As shown in examples 217 through 222, and examples 225 through 228, in Table 8, when the Meyer hardness of the surface of the bonding wire was 0.2 to 2.0 GPa, the aforementioned neck damage could be controlled even after performing the low loop bonding (column titled "76.2 μm (3 mil)-low loop neck damage").

As shown in examples 234 through 242, and examples 246 through 249, in Table 9, when the core wire was actually made of the copper alloy containing at least one of B, P and Se by a total amount of 5 to 300 ppm by mass, bending of the loops could be controlled even after performing the long bonding (column titled "5.3 mm (210 mil)-long bending"). Here, as shown in an example 243, the chip damage was observed when the aforementioned total amount added to the core wire exceeded 300 ppm by mass.

As shown in examples 250 through 260 in Table 10, it was found that the aforementioned effects of the present invention could be achieved even when there was formed a diffusion layer between the coating layer and the core wire and copper contained in the core wire was diffused into the coating layer.

TABLE 1

| | | Palladium-containing coating layer | | Alloy layer of palladium and silver | | | | | | | | |
|---|---|---|---|---|---|---|---|---|---|---|---|---|
| | Core material | Coating layer | Coating layer thickness (nm) | Alloy layer | Alloy layer thickness (nm) | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
| Working example 1 | Cu | Pd | 10 | Ag10Pd90 | 1 | ○ | Δ | ○ | ⊚ | Δ | ○ | ○ |
| Working example 2 | Cu | Pd | 10 | Ag10Pd90 | 1 | ○ | Δ | ○ | ⊚ | Δ | ○ | ○ |
| Working example 3 | Cu | Pd | 10 | Ag10Pd90 | 1 | ○ | Δ | ○ | ⊚ | Δ | ○ | ○ |
| Working example 4 | Cu | Pd | 10 | Ag10Pd90 | 3 | ○ | Δ | ○ | ⊚ | ○ | ○ | ○ |
| Working example 5 | Cu | Pd | 100 | Ag10Pd90 | 3 | ○ | Δ | ○ | ⊚ | ○ | ○ | ○ |
| Working example 6 | Cu | Pd | 200 | Ag10Pd90 | 3 | ○ | Δ | ○ | ⊚ | ○ | ○ | ○ |
| Working example 7 | Cu | Pd | 10 | Ag10Pd90 | 15 | ○ | Δ | ○ | ⊚ | ○ | ○ | ○ |
| Working example 8 | Cu | Pd | 100 | Ag10Pd90 | 15 | ○ | Δ | ○ | ⊚ | ○ | ○ | ○ |
| Working example 9 | Cu | Pd | 200 | Ag10Pd90 | 15 | ○ | Δ | ○ | ⊚ | ○ | ○ | ○ |
| Working example 10 | Cu | Pd | 10 | Ag10Pd90 | 30 | ○ | Δ | ○ | ⊚ | ○ | ○ | ○ |
| Working example 11 | Cu | Pd | 100 | Ag10Pd90 | 30 | ○ | Δ | ○ | ⊚ | ○ | ○ | ○ |
| Working example 12 | Cu | Pd | 200 | Ag10Pd90 | 30 | ○ | Δ | ○ | ⊚ | ○ | ○ | ○ |
| Working example 13 | Cu | Pd | 10 | Ag10Pd90 | 80 | Δ | Δ | Δ | ⊚ | Δ | Δ | Δ |
| Working example 14 | Cu | Pd | 100 | Ag10Pd90 | 80 | Δ | Δ | Δ | ⊚ | Δ | Δ | Δ |
| Working | Cu | Pd | 200 | Ag10Pd90 | 80 | Δ | Δ | Δ | ⊚ | Δ | Δ | Δ |

TABLE 1-continued

| | Core material | Palladium-containing coating layer | | Alloy layer of palladium and silver | | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|
| | | Coating layer | Coating layer thickness (nm) | Alloy layer | Alloy layer thickness (nm) | | | | | | | |
| Working example 15 | Cu | Pd | 10 | Ag20Pd80 | 1 | ○ | Δ | ○ | ◎ | Δ | ◎ | ◎ |
| Working example 16 | Cu | Pd | 100 | Ag20Pd80 | 1 | ○ | Δ | ○ | ◎ | Δ | ◎ | ◎ |
| Working example 17 | Cu | Pd | 200 | Ag20Pd80 | 1 | ○ | Δ | ○ | ◎ | Δ | ◎ | ◎ |
| Working example 18 | Cu | Pd | 10 | Ag20Pd80 | 3 | ○ | Δ | ○ | ◎ | ○ | ◎ | ◎ |
| Working example 19 | Cu | Pd | 100 | Ag20Pd80 | 3 | ○ | Δ | ○ | ◎ | ○ | ◎ | ◎ |
| Working example 20 | Cu | Pd | 200 | Ag20Pd80 | 3 | ○ | Δ | ○ | ◎ | ○ | ◎ | ◎ |
| Working example 21 | Cu | Pd | 10 | Ag20Pd80 | 15 | ○ | Δ | ○ | ◎ | ○ | ◎ | ◎ |
| Working example 22 | Cu | Pd | 100 | Ag20Pd80 | 15 | ○ | Δ | ○ | ◎ | ○ | ◎ | ◎ |
| Working example 23 | Cu | Pd | 200 | Ag20Pd80 | 15 | ○ | Δ | ○ | ◎ | ○ | ◎ | ◎ |
| Working example 24 | Cu | Pd | 10 | Ag20Pd80 | 30 | ○ | Δ | ○ | ◎ | ○ | ◎ | ◎ |
| Working example 25 | Cu | Pd | 100 | Ag20Pd80 | 30 | ○ | Δ | ○ | ◎ | ○ | ◎ | ◎ |
| Working example 26 | Cu | Pd | 200 | Ag20Pd80 | 30 | ○ | Δ | ○ | ◎ | ○ | ◎ | ◎ |
| Working example 27 | Cu | Pd | 10 | Ag20Pd80 | 80 | Δ | Δ | Δ | ◎ | Δ | ◎ | ◎ |
| Working example 28 | Cu | Pd | 100 | Ag20Pd80 | 80 | Δ | Δ | Δ | ◎ | Δ | ◎ | ◎ |
| Working example 29 | Cu | Pd | 200 | Ag20Pd80 | 80 | Δ | Δ | Δ | ◎ | Δ | ◎ | ◎ |
| Working example 30 | Cu | Pd | 10 | Ag30Pd70 | 1 | ○ | Δ | ○ | ◎ | Δ | ◎◎ | ◎◎ |
| Working example 31 | Cu | Pd | 100 | Ag40Pd60 | 1 | ○ | Δ | ○ | ◎ | Δ | ◎◎ | ◎◎ |
| Working example 32 | Cu | Pd | 200 | Ag30Pd70 | 1 | ○ | Δ | ○ | ◎ | Δ | ◎◎ | ◎◎ |
| Working example 33 | Cu | Pd | 10 | Ag30Pd70 | 3 | ○ | Δ | ○ | ◎ | ○ | ◎◎ | ◎◎ |
| Working example 34 | Cu | Pd | 100 | Ag40Pd60 | 3 | ○ | Δ | ○ | ◎ | ○ | ◎◎ | ◎◎ |
| Working example 35 | Cu | Pd | 200 | Ag30Pd70 | 3 | ○ | Δ | ○ | ◎ | ○ | ◎◎ | ◎◎ |
| Working example 36 | Cu | Pd | 10 | Ag40Pd60 | 15 | ○ | Δ | ○ | ◎ | ○ | ◎◎ | ◎◎ |
| Working example 37 | Cu | Pd | 100 | Ag30Pd70 | 15 | ○ | Δ | ○ | ◎ | ○ | ◎◎ | ◎◎ |
| Working example 38 | Cu | Pd | 200 | Ag40Pd60 | 15 | ○ | Δ | ○ | ◎ | ○ | ◎◎ | ◎◎ |
| Working example 39 | Cu | Pd | 10 | Ag30Pd70 | 30 | ○ | Δ | ○ | ◎ | ○ | ◎◎ | ◎◎ |
| Working example 40 | Cu | Pd | 100 | Ag40Pd60 | 30 | ○ | Δ | ○ | ◎ | ○ | ◎◎ | ◎◎ |
| Working example 41 | Cu | Pd | 200 | Ag30Pd70 | 30 | ○ | Δ | ○ | ◎ | ○ | ◎◎ | ◎◎ |
| Working example 42 | Cu | Pd | 10 | Ag30Pd70 | 80 | Δ | Δ | Δ | ◎ | Δ | ◎◎ | ◎◎ |
| Working example 43 | Cu | Pd | 100 | Ag30Pd70 | 80 | Δ | Δ | Δ | ◎ | Δ | ◎◎ | ◎◎ |
| Working example 44 | Cu | Pd | 200 | Ag30Pd70 | 80 | Δ | Δ | Δ | ◎ | Δ | ◎◎ | ◎◎ |
| Working example 45 | Cu | Pd | 10 | Ag50Pd50 | 1 | ○ | Δ | ○ | ◎ | ○ | ◎◎ | ◎◎ |
| Working example 46 | Cu | Pd | 100 | Ag60Pd40 | 1 | ○ | Δ | ○ | ◎ | ○ | ◎◎ | ◎◎ |
| Working example 47 | Cu | Pd | 200 | Ag70Pd30 | 1 | ○ | Δ | ○ | ◎ | ○ | ◎◎ | ◎◎ |
| Working example 48 | Cu | Pd | 10 | Ag50Pd50 | 3 | ○ | Δ | ○ | ◎ | ○ | ◎◎ | ◎◎ |
| Working example 49 | Cu | Pd | 100 | Ag60Pd40 | 3 | ○ | Δ | ○ | ◎ | ○ | ◎◎ | ◎◎ |

TABLE 1-continued

| | Core material | Palladium-containing coating layer | | Alloy layer of palladium and silver | | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|
| | | Coating layer | Coating layer thickness (nm) | Alloy layer | Alloy layer thickness (nm) | | | | | | | |
| Working example 51 | Cu | Pd | 200 | Ag70Pd30 | 3 | ○ | △ | ○ | ◎ | ◎ | ◎◎ | ◎◎ |
| Working example 52 | Cu | Pd | 10 | Ag70Pd30 | 15 | ○ | △ | ○ | ◎ | ◎ | ◎◎ | ◎◎ |
| Working example 53 | Cu | Pd | 100 | Ag60Pd40 | 15 | ○ | △ | ○ | ◎ | ◎ | ◎◎ | ◎◎ |
| Working example 54 | Cu | Pd | 200 | Ag50Pd50 | 15 | ○ | △ | ○ | ◎ | ◎ | ◎◎ | ◎◎ |
| Working example 55 | Cu | Pd | 10 | Ag60Pd40 | 30 | ○ | △ | ○ | ◎ | ◎ | ◎◎ | ◎◎ |
| Working example 56 | Cu | Pd | 100 | Ag70Pd30 | 30 | ○ | △ | ○ | ◎ | ◎ | ◎◎ | ◎◎ |
| Working example 57 | Cu | Pd | 200 | Ag50Pd50 | 30 | ○ | △ | ○ | ◎ | ◎ | ◎◎ | ◎◎ |
| Working example 58 | Cu | Pd | 10 | Ag50Pd50 | 80 | △ | △ | △ | ◎ | ◎ | ◎◎ | ◎◎ |
| Working example 59 | Cu | Pd | 100 | Ag50Pd50 | 80 | △ | △ | △ | ◎ | ◎ | ◎◎ | ◎◎ |
| Working example 60 | Cu | Pd | 200 | Ag50Pd50 | 80 | △ | △ | △ | ◎ | ◎ | ◎◎ | ◎◎ |
| Working example 61 | Cu | Pd | 10 | Ag75Pd25 | 80 | △ | △ | △ | △ | ◎ | ◎◎ | ◎◎ |
| Working example 62 | Cu | Pd | 100 | Ag75Pd25 | 80 | △ | △ | △ | △ | ◎ | ◎◎ | ◎◎ |
| Working example 63 | Cu | Pd | 200 | Ag75Pd25 | 80 | △ | △ | △ | △ | ◎ | ◎◎ | ◎◎ |
| Comparative example 1 | Cu | None | 0 | None | 0 | X | ○ | X | X | X | ○ | ○ |
| Comparative example 2 | Cu | Ag | 200 | None | 0 | ○ | ○ | ○ | X | ◎ | ◎◎ | ◎◎ |
| Comparative example 3 | Cu | Pd | 100 | None | 0 | ○ | ○ | ○ | ◎ | X | X | X |
| Comparative example 4 | Cu | Pd | 5 | None | 0 | X | ○ | X | X | X | X | X |
| Comparative example 5 | Cu | Pd | 210 | None | 0 | ○ | ○ | ○ | ◎ | X | X | X Bubbles also on surface |
| Comparative example 6 | Cu | Pd | 10 | Ag10Pd90 | 0 | ○ | △ | ○ | ◎ | X | X | X |
| Comparative example 7 | Cu | Pd | 100 | Ag10Pd90 | 90 | X | △ | X | X | X | X | X |
| Comparative example 8 | Cu | Pd | 200 | Ag5Pd95 | 3 | ○ | △ | ○ | ◎ | X | X | X |
| Comparative example 9 | Cu | Pd | 200 | Ag80Pd20 | 30 | ○ | △ | ○ | X | ◎ | ◎◎ | ◎◎ |
| Comparative example 10 | Cu | Pd | 210 | Ag20Pd80 | 15 | ○ | △ | ○ | ◎ | ○ | ◎ | X Bubbles also on surface |

TABLE 2

| | Core material | Palladium-containing coating layer | | Alloy layer of palladium and silver | | Area of crystal grains with <100> crystal orientations angled at 15 degrees or less with respect to drawing direction (%) | Area of crystal grains with <111> crystal orientations angled at 15 degrees or less with respect to drawing direction (%) | Reverse bonding crinkle control | High loop leaning control |
|---|---|---|---|---|---|---|---|---|---|
| | | Coating layer | Coating layer thickness (nm) | Alloy layer | Alloy layer thickness (nm) | | | | |
| Working example 4 | Cu | Pd | 10 | Ag10Pd90 | 3 | 40 | 60 | ○ | ◎ |
| Working example 5 | Cu | Pd | 100 | Ag10Pd90 | 3 | 30 | 70 | ○ | ◎◎ |
| Working example 6 | Cu | Pd | 200 | Ag10Pd90 | 3 | 20 | 80 | ○ | ◎◎ |
| Working example 64 | Cu | Pd | 10 | Ag10Pd90 | 1 | 50 | 50 | ◎ | ○ |
| Working example 65 | Cu | Pd | 10 | Ag10Pd90 | 1 | 60 | 40 | ◎ | ○ |
| Working example 66 | Cu | Pd | 10 | Ag10Pd90 | 1 | 70 | 30 | ◎◎ | ○ |
| Working example 67 | Cu | Pd | 10 | Ag10Pd90 | 1 | 100 | 0 | ◎◎ | ○ |
| Working example 68 | Cu | Pd | 10 | Ag10Pd90 | 3 | 50 | 50 | ◎ | ○ |
| Working example 69 | Cu | Pd | 10 | Ag10Pd90 | 3 | 60 | 40 | ◎ | ○ |
| Working example 70 | Cu | Pd | 10 | Ag10Pd90 | 3 | 70 | 30 | ◎◎ | ○ |
| Working example 71 | Cu | Pd | 10 | Ag10Pd90 | 3 | 100 | 0 | ◎◎ | ○ |

TABLE 2-continued

| | Core material | Palladium-containing coating layer Coating layer | Palladium-containing coating layer Coating layer thickness (nm) | Alloy layer of palladium and silver Alloy layer | Alloy layer of palladium and silver Alloy layer thickness (nm) | Area of crystal grains with <100> crystal orientations angled at 15 degrees or less with respect to drawing direction (%) | Area of crystal grains with <111> crystal orientations angled at 15 degrees or less with respect to drawing direction (%) | Reverse bonding crinkle control | High loop leaning control |
|---|---|---|---|---|---|---|---|---|---|
| Working example 72 | Cu | Pd | 100 | Ag20Pd80 | 15 | 50 | 50 | ◎ | ○ |
| Working example 73 | Cu | Pd | 100 | Ag20Pd80 | 15 | 60 | 40 | ◎ | ○ |
| Working example 74 | Cu | Pd | 100 | Ag20Pd80 | 15 | 70 | 30 | ◎◎ | ○ |
| Working example 75 | Cu | Pd | 100 | Ag20Pd80 | 15 | 100 | 0 | ◎◎ | ○ |
| Working example 76 | Cu | Pd | 10 | Ag30Pd70 | 30 | 50 | 50 | ◎ | ○ |
| Working example 77 | Cu | Pd | 10 | Ag30Pd70 | 30 | 60 | 40 | ◎ | ○ |
| Working example 78 | Cu | Pd | 10 | Ag30Pd70 | 30 | 70 | 30 | ◎◎ | ○ |
| Working example 79 | Cu | Pd | 10 | Ag30Pd70 | 30 | 100 | 0 | ◎◎ | ○ |
| Working example 80 | Cu | Pd | 10 | Ag30Pd70 | 80 | 50 | 50 | ◎ | ○ |
| Working example 81 | Cu | Pd | 10 | Ag30Pd70 | 80 | 60 | 40 | ◎ | ○ |
| Working example 82 | Cu | Pd | 10 | Ag30Pd70 | 80 | 70 | 30 | ◎◎ | ○ |
| Working example 83 | Cu | Pd | 10 | Ag30Pd70 | 80 | 100 | 0 | ◎◎ | ○ |
| Working example 84 | Cu | Pd | 200 | Ag70Pd30 | 15 | 50 | 50 | ◎ | ○ |
| Working example 85 | Cu | Pd | 200 | Ag70Pd30 | 15 | 60 | 40 | ◎ | ○ |
| Working example 86 | Cu | Pd | 200 | Ag70Pd30 | 15 | 70 | 30 | ◎◎ | ○ |
| Working example 87 | Cu | Pd | 200 | Ag70Pd30 | 15 | 100 | 0 | ◎◎ | ○ |
| Working example 88 | Cu | Pd | 200 | Ag75Pd25 | 15 | 50 | 50 | ◎ | ○ |
| Working example 89 | Cu | Pd | 200 | Ag75Pd25 | 15 | 60 | 40 | ◎ | ○ |
| Working example 90 | Cu | Pd | 200 | Ag75Pd25 | 15 | 70 | 30 | ◎◎ | ○ |
| Working example 91 | Cu | Pd | 200 | Ag75Pd25 | 15 | 100 | 0 | ◎◎ | ○ |

TABLE 3

| | Core material | Palladium-containing coating layer Coating | Palladium-containing coating layer Coating layer thickness (nm) | Alloy layer of palladium and silver Alloy layer | Alloy layer of palladium and silver Alloy layer thickness (nm) | Area of crystal grains with <100> crystal orientations angled at 15 degrees or less with respect to drawing direction (%) | Meyer hardness of wire surface (GPa) | Reverse bonding crinkle control | 76.2 μm (3 mil)-low loop neck damage |
|---|---|---|---|---|---|---|---|---|---|
| Working example 4 | Cu | Pd | 10 | Ag10Pd90 | 3 | 40 | 0.1 | ○ | ○ |
| Working example 92 | Cu | Pd | 10 | Ag10Pd90 | 1 | 40 | 0.2 | ○ | ◎ |
| Working example 93 | Cu | Pd | 10 | Ag10Pd90 | 3 | 40 | 0.2 | ○ | ◎ |
| Working example 94 | Cu | Pd | 10 | Ag10Pd90 | 3 | 40 | 0.5 | ○ | ◎ |
| Working example 95 | Cu | Pd | 10 | Ag10Pd90 | 3 | 40 | 1.0 | ○ | ◎ |
| Working example 96 | Cu | Pd | 10 | Ag10Pd90 | 3 | 40 | 2.0 | ○ | ◎ |
| Working example 97 | Cu | Pd | 10 | Ag10Pd90 | 3 | 40 | 2.2 | ○ | ○ |
| Working example 98 | Cu | Pd | 50 | Ag20Pd80 | 5 | 50 | 0.1 | ◎ | ○ |
| Working example 99 | Cu | Pd | 100 | Ag30Pd70 | 10 | 60 | 0.2 | ◎ | ◎ |
| Working example 100 | Cu | Pd | 200 | Ag40Pd60 | 20 | 70 | 0.5 | ◎◎ | ◎ |
| Working example 101 | Cu | Pd | 60 | Ag50Pd50 | 25 | 80 | 1.0 | ◎◎ | ◎ |
| Working example 102 | Cu | Pd | 150 | Ag60Pd40 | 8 | 90 | 2.0 | ◎◎ | ◎ |
| Working example 103 | Cu | Pd | 180 | Ag70Pd30 | 17 | 100 | 0.1 | ◎◎ | ○ |
| Working example 104 | Cu | Pd | 200 | Ag75Pd25 | 20 | 70 | 0.5 | ◎◎ | ◎ |

TABLE 4

| | Core material Core material remainder (except unavoidable impurity) | Core material Elements added to core material (mass ppm) | Palladium-containing coating layer Coating layer | Palladium-containing coating layer Coating layer thickness (nm) | Alloy layer of palladium and silver Alloy layer | Alloy layer of palladium and silver Alloy layer thickness (nm) | Area of crystal grains with <100> crystal orientations angled at 15 degrees or less with respect to drawing direction (%) | Meyer hardness of coating layer surface (GPa) | Reverse bonding crinkle control | 76.2 μm (3 mil)-low loop neck damage | 5.3 mm (210 mil)-long loop bending |
|---|---|---|---|---|---|---|---|---|---|---|---|
| Working example 4 | Cu | None | Pd | 10 | Ag10Pd90 | 3 | 40 | 0.1 | ○ | ○ | ○ |
| Working example 105 | Cu | 5 ppm Ca | Pd | 10 | Ag10Pd90 | 3 | 40 | 0.1 | ○ | ○ | ○ |

TABLE 4-continued

| | Core material | | Palladium-containing coating layer | | Alloy layer of palladium and silver | | Area of crystal grains with <100> crystal orientations angled at 15 degrees or less with respect to drawing direction (%) | Meyer hardness of coating layer surface (GPa) | Reverse bonding crinkle control | 76.2 μm (3 mil)- low loop neck damage | 5.3 mm (210 mil)- long bending |
|---|---|---|---|---|---|---|---|---|---|---|---|
| | Core material remainder (except unavoidable impurity) | Elements added to core material (mass ppm) | Coating layer | Coating layer thickness (nm) | Alloy layer | Alloy layer thickness (nm) | | | | | |
| Working example 106 | Cu | 10 ppm Al | Pd | 10 | Ag10Pd90 | 3 | 40 | 0.1 | ◯ | ◯ | ◯ |
| Working example 107 | Cu | 20 ppm Ag | Pd | 10 | Ag10Pd90 | 3 | 40 | 0.1 | ◯ | ◯ | ◯ |
| Working example 108 | Cu | 4 ppm B | Pd | 10 | Ag10Pd90 | 3 | 40 | 0.1 | ◯ | ◯ | ◯ |
| Working example 109 | Cu | 5 ppm B | Pd | 10 | Ag10Pd90 | 3 | 40 | 0.1 | ◯ | ◯ | ◎ |
| Working example 110 | Cu | 5 ppm P | Pd | 10 | Ag10Pd90 | 3 | 40 | 0.1 | ◯ | ◯ | ◎ |
| Working example 111 | Cu | 5 ppm Se | Pd | 10 | Ag10Pd90 | 3 | 40 | 0.1 | ◯ | ◯ | ◎ |
| Working example 112 | Cu | 10 ppm B | Pd | 10 | Ag10Pd90 | 3 | 40 | 0.1 | ◯ | ◯ | ◎ |
| Working example 113 | Cu | 10 ppm P | Pd | 10 | Ag10Pd90 | 3 | 40 | 0.1 | ◯ | ◯ | ◎ |
| Working example 114 | Cu | 10 ppm Se | Pd | 10 | Ag10Pd90 | 3 | 40 | 0.1 | ◯ | ◯ | ◎ |
| Working example 115 | Cu | 300 ppm B | Pd | 10 | Ag10Pd90 | 3 | 40 | 0.1 | ◯ | ◯ | ◎ |
| Working example 116 | Cu | 300 ppm P | Pd | 10 | Ag10Pd90 | 3 | 40 | 0.1 | ◯ | ◯ | ◎ |
| Working example 117 | Cu | 300 ppm Se | Pd | 10 | Ag10Pd90 | 3 | 40 | 0.1 | ◯ | ◯ | ◎ |
| Working example 118 | Cu | 310 ppm P | Pd | 10 | Ag10Pd90 | 3 | 40 | 0.1 | ◯ | ◯ | ◎ |
| Working example 119 | Cu | None | Pd | 10 | Ag10Pd90 | 3 | 50 | 0.2 | ◎ | ◎ | ◯ |
| Working example 120 | Cu | 5 ppm Al | Pd | 10 | Ag10Pd90 | 3 | 50 | 0.2 | ◎ | ◎ | ◯ |
| Working example 121 | Cu | 8 ppm B | Pd | 10 | Ag10Pd90 | 3 | 50 | 0.5 | ◎ | ◎ | ◎ |
| Working example 122 | Cu | 15 ppm P | Pd | 10 | Ag10Pd90 | 3 | 50 | 1.0 | ◎ | ◎ | ◎ |
| Working example 123 | Cu | 30 ppm Se | Pd | 10 | Ag10Pd90 | 3 | 50 | 2.0 | ◎ | ◎ | ◎ |
| Working example 124 | Cu | 7 ppm P | Pd | 10 | Ag10Pd90 | 3 | 40 | 2.2 | ◯ | ◯ | ◎ |

TABLE 5

| | Core material | Diffusion layer | | Palladium-containing coating layer | | Alloy layer of palladium and silver | | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|---|---|
| | | Diffusion layer | Diffusion layer thickness (nm) | Coating layer | Coating layer thickness (nm) | Alloy layer | Alloy layer thickness (nm) | | | | | | | |
| Working example 125 | Cu | None | 0 | Cu50Pd50 | 40 | Ag10Pd90 | 1 | ◯ | Δ | ◯ | ◎ | Δ | ◯ | ◯ |
| Working example 126 | Cu | None | 0 | Cu50Pd50 | 40 | Ag10Pd90 | 3 | ◯ | Δ | ◯ | ◎ | ◯ | ◯ | ◯ |

TABLE 5-continued

| | Core material | Diffusion layer | Diffusion layer thickness (nm) | Palladium-containing coating layer | Coating layer thickness (nm) | Alloy layer of palladium and silver | Alloy layer thickness (nm) | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|---|---|
| Working example 127 | Cu | None | 0 | Cu50Pd50 | 50 | Ag20Pd80 | 3 | ○ | Δ | ○ | ◎ | ○ | ◎ | ◎ |
| Working example 128 | Cu | None | 0 | Cu30Pd70 | 50 | Ag10Pd60Cu30 | 5 | ○ | Δ | ○ | ◎ | ○ | ◎ | ◎ |
| Working example 129 | Cu | Cu20Pd80 | 10 | Cu8Pd90Ag2 | 80 | Ag30Pd70 | 10 | ○ | Δ | ○ | ◎ | ○ | ◎◎ | ◎◎ |
| Working example 130 | Cu | None | 0 | Cu9Pd90Ag1 | 100 | Ag50Pd50 | 15 | ○ | Δ | ○ | ○ | ◎ | ◎◎ | ◎◎ |
| Working example 131 | Cu | None | 0 | Cu10Pd90 | 200 | Ag10Pd90 | 20 | ○ | Δ | ○ | ◎ | ○ | ○ | ○ |
| Working example 132 | Cu | None | 0 | Cu10Pd90 | 40 | Ag20Pd80 | 25 | ○ | Δ | ○ | ◎ | ○ | ◎ | ◎ |
| Working example 133 | Cu | Cu20Pd80 | 10 | Cu41Pd50Ag9 | 60 | Ag30Pd70 | 30 | ○ | Δ | ○ | ◎ | ○ | ◎◎ | ◎◎ |
| Working example 134 | Cu | None | 0 | Cu9Pd90Ag1 | 90 | Ag50Pd50 | 3 | ○ | Δ | ○ | ○ | ◎ | ◎◎ | ◎◎ |
| Working example 135 | Cu | None | 0 | Cu50Pd50 | 200 | Ag50Pd50 | 20 | ○ | Δ | ○ | ○ | ◎ | ◎◎ | ◎◎ |

TABLE 6

| | Core material | Palladium-containing coating layer | Coating layer thickness (nm) | Alloy layer of palladium and gold | Alloy layer thickness (nm) | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|
| Working example 136 | Cu | Pd | 10 | Au15Pd85 | 1 | ○ | ○ | ○ | ◎ | Δ | Δ | ○ |
| Working example 137 | Cu | Pd | 100 | Au15Pd85 | 1 | ○ | ○ | ○ | ◎ | Δ | Δ | ○ |
| Working example 138 | Cu | Pd | 200 | Au15Pd85 | 1 | ○ | ○ | ○ | ◎ | Δ | Δ | ○ |
| Working example 139 | Cu | Pd | 10 | Au10Pd90 | 3 | ○ | ○ | ○ | ◎ | Δ | Δ | ○ |

TABLE 6-continued

| | Core material | Coating layer | Coating layer thickness (nm) | Alloy layer | Alloy layer thickness (nm) | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|
| Working example 140 | Cu | Pd | 10 | Au10Pd90 | 3 | ○ | ○ | ○ | ◎ | Δ | Δ | ○ |
| Working example 141 | Cu | Pd | 10 | Au10Pd90 | 3 | ○ | ○ | ○ | ◎ | Δ | Δ | ○ |
| Working example 142 | Cu | Pd | 10 | Au10Pd90 | 3 | ○ | ○ | ○ | ◎ | Δ | Δ | ○ |
| Working example 143 | Cu | Pd | 10 | Au10Pd90 | 3 | ○ | ○ | ○ | ◎ | Δ | Δ | ○ |
| Working example 144 | Cu | Pd | 10 | Au10Pd90 | 3 | ○ | ○ | ○ | ◎ | Δ | Δ | ○ |
| Working example 145 | Cu | Pd | 10 | Au10Pd90 | 3 | ○ | ○ | ○ | ◎ | Δ | Δ | ○ |
| Working example 146 | Cu | Pd | 10 | Au10Pd90 | 3 | ○ | ○ | ○ | ◎ | Δ | Δ | ○ |
| Working example 147 | Cu | Pd | 10 | Au10Pd90 | 3 | ○ | ○ | ○ | ◎ | Δ | Δ | ○ |
| Working example 148 | Cu | Pd | 10 | Au15Pd85 | 3 | ○ | ○ | ○ | ◎ | ○ | Δ | ○ |
| Working example 149 | Cu | Pd | 100 | Au15Pd85 | 3 | ○ | ○ | ○ | ◎ | ○ | Δ | ○ |
| Working example 150 | Cu | Pd | 200 | Au15Pd85 | 3 | ○ | ○ | ○ | ◎ | ○ | Δ | ○ |
| Working example 151 | Cu | Pd | 10 | Au15Pd85 | 40 | ○ | ○ | ○ | ◎ | ○ | Δ | ○ |
| Working example 152 | Cu | Pd | 100 | Au15Pd85 | 40 | ○ | ○ | ○ | ◎ | ○ | Δ | ○ |
| Working example 153 | Cu | Pd | 200 | Au15Pd85 | 40 | ○ | ○ | ○ | ◎ | ○ | Δ | ○ |
| Working example 154 | Cu | Pd | 10 | Au15Pd85 | 80 | ○ | ○ | ○ | ◎ | ○ | Δ | ○ |
| Working example 155 | Cu | Pd | 100 | Au15Pd85 | 80 | ○ | ○ | ○ | ◎ | ○ | Δ | ○ |
| Working example 156 | Cu | Pd | 200 | Au15Pd85 | 80 | ○ | ○ | ○ | ◎ | ○ | Δ | ○ |
| Working example 157 | Cu | Pd | 10 | Au38Pd62 | 1 | ○ | ○ | ○ | ◎ | Δ | Δ | ○ |
| Working example 158 | Cu | Pd | 100 | Au38Pd62 | 1 | ○ | ○ | ○ | ◎ | Δ | Δ | ○ |
| Working example 159 | Cu | Pd | 200 | Au38Pd62 | 1 | ○ | ○ | ○ | ◎ | Δ | Δ | ○ |
| Working example 160 | Cu | Pd | 10 | Au38Pd62 | 3 | ○ | ○ | ○ | ◎ | ○ | Δ | ○ |
| Working example 161 | Cu | Pd | 100 | Au38Pd62 | 3 | ○ | ○ | ○ | ◎ | ○ | Δ | ○ |
| Working example 162 | Cu | Pd | 200 | Au38Pd62 | 3 | ○ | ○ | ○ | ◎ | ○ | Δ | ○ |
| Working example 163 | Cu | Pd | 10 | Au38Pd62 | 40 | ○ | ○ | ○ | ◎ | ○ | Δ | ○ |
| Working example 164 | Cu | Pd | 100 | Au38Pd62 | 40 | ○ | ○ | ○ | ◎ | ○ | Δ | ○ |
| Working example 165 | Cu | Pd | 200 | Au38Pd62 | 40 | ○ | ○ | ○ | ◎ | ○ | Δ | ○ |
| Working example 166 | Cu | Pd | 10 | Au38Pd62 | 80 | ○ | ○ | ○ | ◎ | ○ | Δ | ○ |
| Working example 167 | Cu | Pd | 100 | Au38Pd62 | 80 | ○ | ○ | ○ | ◎ | ○ | Δ | ○ |
| Working example 168 | Cu | Pd | 200 | Au38Pd62 | 80 | ○ | ○ | ○ | ◎ | ○ | Δ | ○ |
| Working example 169 | Cu | Pd | 10 | Au40Pd60 | 3 | ○ | ○ | ○ | ○ | ◎ | Δ | ○ |
| Working example 170 | Cu | Pd | 100 | Au50Pd50 | 3 | ○ | ○ | ○ | ○ | ◎ | Δ | ○ |
| Working example 171 | Cu | Pd | 200 | Au40Pd60 | 3 | ○ | ○ | ○ | ○ | ◎ | Δ | ○ |
| Working example 172 | Cu | Pd | 10 | Au40Pd60 | 3 | ○ | ○ | ○ | ○ | ◎ | Δ | ○ |
| Working example 173 | Cu | Pd | 100 | Au50Pd50 | 3 | ○ | ○ | ○ | ○ | ◎ | Δ | ○ |
| Working example 174 | Cu | Pd | 200 | Au40Pd60 | 3 | ○ | ○ | ○ | ○ | ◎ | Δ | ○ |

TABLE 6-continued

| | Core material | Palladium-containing coating layer | | Alloy layer of palladium and gold | | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|---|---|---|---|---|
| | | Coating layer | Coating layer thickness (nm) | Alloy layer | Alloy layer thickness (nm) | | | | | | | |
| Working example 175 | Cu | Pd | 10 | Au50Pd50 | 40 | ○ | ○ | ○ | ○ | ◎ | Δ | ○ |
| Working example 176 | Cu | Pd | 100 | Au40Pd60 | 40 | ○ | ○ | ○ | ○ | ◎ | Δ | ○ |
| Working example 177 | Cu | Pd | 200 | Au50Pd50 | 40 | ○ | ○ | ○ | ○ | ◎ | Δ | ○ |
| Working example 178 | Cu | Pd | 10 | Au40Pd60 | 80 | ○ | ○ | ○ | ○ | ◎ | Δ | ○ |
| Working example 179 | Cu | Pd | 100 | Au50Pd50 | 80 | ○ | ○ | ○ | ○ | ◎ | Δ | ○ |
| Working example 180 | Cu | Pd | 200 | Au40Pd60 | 80 | ○ | ○ | ○ | ○ | ◎ | Δ | ○ |
| Working example 181 | Cu | Pd | 10 | Au60Pd40 | 3 | ○ | ○ | ○ | ○ | ◎ | Δ | ○ |
| Working example 182 | Cu | Pd | 100 | Au70Pd30 | 3 | ○ | ○ | ○ | ○ | ◎ | Δ | ○ |
| Working example 183 | Cu | Pd | 200 | Au75Pd25 | 3 | ○ | ○ | ○ | ○ | ◎ | Δ | ○ |
| Working example 184 | Cu | Pd | 10 | Au60Pd40 | 3 | ○ | ○ | ○ | ○ | ◎ | Δ | ○ |
| Working example 185 | Cu | Pd | 100 | Au70Pd30 | 3 | ○ | ○ | ○ | ○ | ◎ | Δ | ○ |
| Working example 186 | Cu | Pd | 200 | Au75Pd25 | 3 | ○ | ○ | ○ | ○ | ◎ | Δ | ○ |
| Working example 187 | Cu | Pd | 10 | Au75Pd25 | 40 | ○ | ○ | ○ | ○ | ◎ | Δ | ○ |
| Working example 188 | Cu | Pd | 100 | Au70Pd30 | 40 | ○ | ○ | ○ | ○ | ◎ | Δ | ○ |
| Working example 189 | Cu | Pd | 200 | Au60Pd40 | 40 | ○ | ○ | ○ | ○ | ◎ | Δ | ○ |
| Working example 190 | Cu | Pd | 10 | Au70Pd30 | 80 | ○ | ○ | ○ | ○ | ◎ | Δ | ○ |
| Working example 191 | Cu | Pd | 100 | Au75Pd25 | 80 | ○ | ○ | ○ | ○ | ◎ | Δ | ○ |
| Working example 192 | Cu | Pd | 200 | Au60Pd40 | 80 | ○ | ○ | ○ | ○ | ◎ | Δ | ○ |
| Comparative example 11 | Cu | Au | 200 | None | 0 | ○ | ○ | ○ | X | ◎ | X | ○ |
| Comparative example 12 | Cu | Pd | 10 | Au15Pd85 | 0 | ○ | ○ | ○ | ◎ | X | Δ | ○ |
| Comparative example 13 | Cu | Pd | 100 | Au15Pd85 | 90 | X | ○ | X | X | X | Δ | ○ |
| Comparative example 14 | Cu | Pd | 200 | Au5Pd95 | 3 | ○ | ○ | ○ | ◎ | X | Δ | ○ |
| Comparative example 15 | Cu | Pd | 200 | Au80Pd20 | 80 | ○ | ○ | ○ | X | ◎ | Δ | ○ |
| Comparative example 16 | Cu | Pd | 210 | Au38Pd62 | 40 | ○ | ○ | ○ | ◎ | ○ | Δ | X |

TABLE 7

| | Core material | Palladium-containing coating layer | | Alloy layer of palladium and gold | | Area of crystal grains with <111> crystal orientations angled at 15 degrees or less with respect to drawing direction (%) | High loop leaning control |
|---|---|---|---|---|---|---|---|
| | | Coating layer | Coating layer thickness (nm) | Alloy layer | Alloy layer thickness (nm) | | |
| Working example 148 | Cu | Pd | 10 | Au15Pd85 | 3 | 40 | ○ |
| Working example 193 | Cu | Pd | 10 | Au15Pd85 | 1 | 50 | ◎ |
| Working example 194 | Cu | Pd | 10 | Au15Pd85 | 1 | 60 | ◎ |
| Working example 195 | Cu | Pd | 10 | Au15Pd85 | 1 | 70 | ◎◎ |
| Working example 196 | Cu | Pd | 10 | Au15Pd85 | 1 | 100 | ◎◎ |
| Working example 197 | Cu | Pd | 10 | Au10Pd90 | 3 | 50 | ◎ |
| Working example 198 | Cu | Pd | 10 | Au10Pd90 | 3 | 60 | ◎ |
| Working example 199 | Cu | Pd | 10 | Au10Pd90 | 3 | 70 | ◎◎ |
| Working example 200 | Cu | Pd | 10 | Au10Pd90 | 3 | 100 | ◎◎ |
| Working example 201 | Cu | Pd | 10 | Au15Pd85 | 3 | 50 | ◎ |

TABLE 7-continued

| | Core material | Palladium-containing coating layer | | Alloy layer of palladium and gold | | Area of crystal grains with <111> crystal orientations | High loop leaning control |
|---|---|---|---|---|---|---|---|
| | | Coating layer | Coating layer thickness (nm) | Alloy layer | Alloy layer thickness (nm) | angled at 15 degrees or less with respect to drawing direction (%) | |
| Working example 202 | Cu | Pd | 10 | Au15Pd85 | 3 | 60 | ⊚ |
| Working example 203 | Cu | Pd | 10 | Au15Pd85 | 3 | 70 | ⊚⊚ |
| Working example 204 | Cu | Pd | 10 | Au15Pd85 | 3 | 100 | ⊚⊚ |
| Working example 205 | Cu | Pd | 100 | Au38Pd62 | 40 | 50 | ⊚ |
| Working example 206 | Cu | Pd | 100 | Au38Pd62 | 40 | 60 | ⊚ |
| Working example 207 | Cu | Pd | 100 | Au38Pd62 | 40 | 70 | ⊚⊚ |
| Working example 208 | Cu | Pd | 100 | Au38Pd62 | 40 | 100 | ⊚⊚ |
| Working example 209 | Cu | Pd | 10 | Au40Pd60 | 80 | 50 | ⊚ |
| Working example 210 | Cu | Pd | 10 | Au40Pd60 | 80 | 60 | ⊚ |
| Working example 211 | Cu | Pd | 10 | Au40Pd60 | 80 | 70 | ⊚⊚ |
| Working example 212 | Cu | Pd | 10 | Au40Pd60 | 80 | 100 | ⊚⊚ |
| Working example 213 | Cu | Pd | 200 | Au75Pd25 | 40 | 50 | ⊚ |
| Working example 214 | Cu | Pd | 200 | Au75Pd25 | 40 | 60 | ⊚ |
| Working example 215 | Cu | Pd | 200 | Au75Pd25 | 40 | 70 | ⊚⊚ |
| Working example 216 | Cu | Pd | 200 | Au75Pd25 | 40 | 100 | ⊚⊚ |

TABLE 8

| | Core material | Palladium-containing coating layer | | Alloy layer of palladium and gold | | Area of crystal grains with <111> crystal orientations | Meyer | | 76.2 μm |
|---|---|---|---|---|---|---|---|---|---|
| | | Coating layer | Coating layer thickness (nm) | Alloy layer | Alloy layer thickness (nm) | angled at 15 degrees or less with respect to drawing direction (%) | hardness of wire surface (GPa) | High loop leaning control | (3 mil)-low loop neck damage |
| Working example 148 | Cu | Pd | 10 | Au15Pd85 | 3 | 40 | 0.1 | ○ | ○ |
| Working example 217 | Cu | Pd | 10 | Au15Pd85 | 1 | 40 | 0.2 | ○ | ⊚ |
| Working example 218 | Cu | Pd | 10 | Au10Pd90 | 3 | 40 | 0.2 | ○ | ⊚ |
| Working example 219 | Cu | Pd | 10 | Au15Pd85 | 3 | 40 | 0.2 | ○ | ⊚ |
| Working example 220 | Cu | Pd | 10 | Au15Pd85 | 3 | 40 | 0.5 | ○ | ⊚ |
| Working example 221 | Cu | Pd | 10 | Au15Pd85 | 3 | 40 | 1.0 | ○ | ⊚ |
| Working example 222 | Cu | Pd | 10 | Au15Pd85 | 3 | 40 | 2.0 | ○ | ⊚ |
| Working example 223 | Cu | Pd | 10 | Au15Pd85 | 3 | 40 | 2.2 | ○ | ○ |
| Working example 224 | Cu | Pd | 50 | Au38Pd62 | 10 | 50 | 0.1 | ⊚ | ○ |
| Working example 225 | Cu | Pd | 100 | Au40Pd60 | 30 | 60 | 0.2 | ⊚ | ⊚ |
| Working example 226 | Cu | Pd | 200 | Au50Pd50 | 60 | 70 | 0.5 | ⊚⊚ | ⊚ |
| Working example 227 | Cu | Pd | 60 | Au60Pd40 | 70 | 80 | 1.0 | ⊚⊚ | ⊚ |
| Working example 228 | Cu | Pd | 150 | Au70Pd30 | 20 | 90 | 2.0 | ⊚⊚ | ⊚ |
| Working example 229 | Cu | Pd | 180 | Au75Pd25 | 50 | 100 | 0.1 | ⊚⊚ | ○ |

TABLE 9

| | Core material | | Palladium-containing coating layer | | Alloy layer of palladium and gold | | Area of crystal grains with <111> crystal orientations angled at 15 degrees or less with respect to drawing direction (%) | Meyer hardness of wire surface (GPa) | High loop leaning control | 76.2 μm (3 mil)- low loop neck damage | 5.3 mm (210 mil)- long bending | Chip damage |
|---|---|---|---|---|---|---|---|---|---|---|---|---|
| | Core material remainder (except unavoidable impurity) | Elements added to core material (mass ppm) | Coating layer | Coating layer thickness (nm) | Alloy layer | Alloy layer thickness (nm) | | | | | | |
| Working example 148 | Cu | None | Pd | 10 | Au15Pd85 | 3 | 40 | 0.1 | ○ | ○ | ○ | ○ |
| Working example 230 | Cu | 5 ppm Ca | Pd | 10 | Au15Pd85 | 3 | 40 | 0.1 | ○ | ○ | ○ | ○ |
| Working example 231 | Cu | 10 ppm Al | Pd | 10 | Au15Pd85 | 3 | 40 | 0.1 | ○ | ○ | ○ | ○ |
| Working example 232 | Cu | 20 ppm Ag | Pd | 10 | Au15Pd85 | 3 | 40 | 0.1 | ○ | ○ | ○ | ○ |
| Working example 233 | Cu | 4 ppm B | Pd | 10 | Au15Pd85 | 3 | 40 | 0.1 | ○ | ○ | ○ | ○ |
| Working example 234 | Cu | 5 ppm B | Pd | 10 | Au15Pd85 | 3 | 40 | 0.1 | ○ | ○ | ◎ | ○ |
| Working example 235 | Cu | 5 ppm P | Pd | 10 | Au15Pd85 | 3 | 40 | 0.1 | ○ | ○ | ◎ | ○ |
| Working example 236 | Cu | 5 ppm Se | Pd | 10 | Au15Pd85 | 3 | 40 | 0.1 | ○ | ○ | ◎ | ○ |
| Working example 237 | Cu | 10 ppm B | Pd | 10 | Au15Pd85 | 3 | 40 | 0.1 | ○ | ○ | ◎ | ○ |
| Working example 238 | Cu | 10 ppm P | Pd | 10 | Au15Pd85 | 3 | 40 | 0.1 | ○ | ○ | ◎ | ○ |
| Working example 239 | Cu | 10 ppm Se | Pd | 10 | Au15Pd85 | 3 | 40 | 0.1 | ○ | ○ | ◎ | ○ |
| Working example 240 | Cu | 300 ppm B | Pd | 10 | Au15Pd85 | 3 | 40 | 0.1 | ○ | ○ | ◎ | ○ |
| Working example 241 | Cu | 300 ppm P | Pd | 10 | Au15Pd85 | 3 | 40 | 0.1 | ○ | ○ | ◎ | ○ |
| Working example 242 | Cu | 300 ppm Se | Pd | 10 | Au15Pd85 | 3 | 40 | 0.1 | ○ | ○ | ◎ | ○ |
| Working example 243 | Cu | 310 ppm P | Pd | 10 | Au15Pd85 | 3 | 40 | 0.1 | ○ | ○ | ◎ | X |
| Working example 244 | Cu | None | Pd | 10 | Au15Pd85 | 3 | 50 | 0.2 | ◎ | ◎ | Δ | ○ |
| Working example 245 | Cu | 5 ppm Al | Pd | 10 | Au15Pd85 | 3 | 50 | 0.2 | ◎ | ◎ | ○ | ○ |
| Working example 246 | Cu | 8 ppm B | Pd | 10 | Au15Pd85 | 3 | 50 | 0.5 | ◎ | ◎ | ◎ | ○ |
| Working example 247 | Cu | 15 ppm P | Pd | 10 | Au15Pd85 | 3 | 50 | 1.0 | ◎ | ◎ | ◎ | ○ |
| Working example 248 | Cu | 30 ppm Se | Pd | 10 | Au15Pd85 | 3 | 50 | 2.0 | ◎ | ◎ | ◎ | ○ |
| Working example 249 | Cu | 7 ppm P | Pd | 10 | Au15Pd85 | 3 | 40 | 2.2 | ○ | ○ | ◎ | ○ |

TABLE 10

| | | Diffusion layer | | Palladium-containing coating layer | | Alloy layer of palladium and gold | |
|---|---|---|---|---|---|---|---|
| | Core material | Diffusion layer | Diffusion layer thickness (nm) | Coating layer | Coating layer thickness (nm) | Alloy layer | Alloy layer thickness (nm) |
| Working example 250 | Cu | None | 0 | Cu50Pd50 | 40 | Au15Pd85 | 3 |
| Working example 251 | Cu | None | 0 | Cu50Pd50 | 40 | Au15Pd85 | 3 |
| Working example 252 | Cu | None | 0 | Cu50Pd50 | 50 | Au40Pd60 | 3 |
| Working example 253 | Cu | None | 0 | Cu30Pd70 | 50 | Au15Pd60Cu25 | 10 |
| Working example 254 | Cu | Cu20Pd80 | 10 | Cu8Pd90Au2 | 80 | Au45Pd55 | 30 |
| Working example 255 | Cu | None | 0 | Cu9Pd90Au1 | 100 | Au70Pd30 | 40 |
| Working example 256 | Cu | None | 0 | Cu10Pd90 | 200 | Au15Pd85 | 60 |
| Working example 257 | Cu | None | 0 | Cu10Pd90 | 40 | Au40Pd60 | 70 |
| Working example 258 | Cu | Cu20Pd80 | 10 | Cu41Pd50Au9 | 60 | Au45Pd55 | 80 |

TABLE 10-continued

| | | | | | | | |
|---|---|---|---|---|---|---|---|
| Working example 259 | Cu | None | 0 | Cu9Pd90Au1 | 90 | Au60Pd40 | 3 |
| Working example 260 | Cu | None | 0 | Cu50Pd50 | 200 | Au60Pd40 | 60 |

| | Long-term storage (oxidation) | Long-term storage (sulfuration) | Ag-L/F 2nd bonding | FAB sphericity in nitrogen | Pd-L/F 2nd bonding | Flaw control | FAB bubble control in nitrogen |
|---|---|---|---|---|---|---|---|
| Working example 250 | ○ | ○ | ○ | ⊚ | ○ | Δ | ○ |
| Working example 251 | ○ | ○ | ○ | ⊚ | ○ | Δ | ○ |
| Working example 252 | ○ | ○ | ○ | ○ | ⊚ | Δ | ○ |
| Working example 253 | ○ | ○ | ○ | ⊚ | ○ | Δ | ○ |
| Working example 254 | ○ | ○ | ○ | ⊚ | ○ | Δ | ○ |
| Working example 255 | ○ | ○ | ○ | ○ | ⊚ | Δ | ○ |
| Working example 256 | ○ | ○ | ○ | ⊚ | ○ | Δ | ○ |
| Working example 257 | ○ | ○ | ○ | ○ | ⊚ | Δ | ○ |
| Working example 258 | ○ | ○ | ○ | ○ | ⊚ | Δ | ○ |
| Working example 259 | ○ | ○ | ○ | ○ | ⊚ | Δ | ○ |
| Working example 260 | ○ | ○ | ○ | ○ | ⊚ | Δ | ○ |

The invention claimed is:

1. A bonding wire for semiconductor, comprising:
a core wire made of copper or a copper alloy;
a coating layer containing palladium, said coating layer being formed on a surface of said core wire, and having a thickness of 10 to 200 nm; and
an alloy layer containing noble metal and palladium, said alloy layer being formed on a surface of said coating layer, and having a thickness of 1 to 80 nm,
wherein said noble metal is gold, and a concentration of the gold in said alloy layer is not less than 10% and not more than 75% by volume, and
wherein of surface crystal grains in said alloy layer, the surface crystal grains having <111> crystal orientations angled at 15 degrees or less to a wire drawing direction occupy an areal percentage of 40% to 100%.

2. The bonding wire for semiconductor according to claim 1, wherein the gold concentration in said alloy layer is not less than 15% and not more than 75% by volume.

3. The bonding wire for semiconductor according to claim 2, wherein the gold concentration in said alloy layer is not less than 40% and not more than 75% by volume.

4. A bonding wire for semiconductor, comprising:
a core wire made of copper or a copper alloy;
a coating layer containing palladium, said coating layer being formed on a surface of said core wire, and having a thickness of 10 to 200 nm; and
an alloy layer containing noble metal and palladium, said alloy layer being formed on a surface of said coating layer, and having a thickness of 1 to 80 nm,
wherein said noble metal is silver, and a concentration of the silver in said alloy layer is not less than 10% and not more than 75% by volume, and
wherein of surface crystal grains in said alloy layer, the surface crystal grains having <100> crystal orientations angled at 15 degrees or less to a wire drawing direction occupy an areal percentage of 50% to 100%.

5. A bonding wire for semiconductor, comprising:
a core wire made of copper or a copper alloy;
a coating layer containing palladium, said coating layer being formed on a surface of said core wire, and having a thickness of 10 to 200 nm; and
an alloy layer containing noble metal and palladium, said alloy layer being formed on a surface of said coating layer, and having a thickness of 1 to 80 nm,
wherein said noble metal is silver, and a concentration of the silver in said alloy layer is not less than 10% and not more than 75% by volume, and
wherein of surface crystal grains in said alloy layer, the surface crystal grains having <111> crystal orientations angled at 15 degrees or less to a wire drawing direction occupy an areal percentage of 60% to 100%.

6. The bonding wire for semiconductor according to claim 1, wherein a Meyer hardness of a surface of said bonding wire is 0.2 GPa to 2.0 GPa.

7. The bonding wire for semiconductor according to claim 1, wherein said core wire contains at least one of B, P and Se in a total amount of 5 to 300 ppm by mass.

8. The bonding wire for semiconductor according to claim 4, wherein said alloy layer has a thickness from 1 nm to 30 nm, and the sliver concentration in said alloy layer is not less than 10% and not more than 70% by volume.

9. The bonding wire for semiconductor according to claim 4, wherein the sliver concentration in said alloy layer is not less than 20% and not more than 70% by volume.

10. The bonding wire for semiconductor according to claim 4, wherein a Meyer hardness of a surface of said bonding wire is 0.2 GPa to 2.0 GPa.

11. The bonding wire for semiconductor according to claim 4, wherein said core wire contains at least one of B, P and Se in a total amount of 5 to 300 ppm by mass.

12. The bonding wire for semiconductor according to claim 5, wherein said alloy layer has a thickness from 1 nm to 30 nm, and the sliver concentration in said alloy layer is not less than 10% and not more than 70% by volume.

13. The bonding wire for semiconductor according to claim 5, wherein the sliver concentration in said alloy layer is not less than 20% and not more than 70% by volume.

14. The bonding wire for semiconductor according to claim 5, wherein a Meyer hardness of a surface of said bonding wire is 0.2 GPa to 2.0 GPa.

15. The bonding wire for semiconductor according to claim 5, wherein said core wire contains at least one of B, P and Se in a total amount of 5 to 300 ppm by mass.

* * * * *